(12) United States Patent
Frederiksen et al.

(10) Patent No.: US 7,391,258 B2
(45) Date of Patent: Jun. 24, 2008

(54) SELF-OSCILLATING POWER CIRCUIT

(75) Inventors: Thomas Mansachs Frederiksen, Århus C (DK); Kim Rishøj Pedersen, Egå (DK)

(73) Assignee: TC Electronic A/S (DK)

( * ) Notice: Subject to any disclaimer, the term of this patent is extended or adjusted under 35 U.S.C. 154(b) by 0 days.

(21) Appl. No.: 10/563,002

(22) PCT Filed: Jun. 27, 2003

(86) PCT No.: PCT/DK03/00447

§ 371 (c)(1),
(2), (4) Date: Mar. 13, 2007

(87) PCT Pub. No.: WO2005/002050

PCT Pub. Date: Jan. 6, 2005

(65) Prior Publication Data

US 2007/0216491 A1    Sep. 20, 2007

(51) Int. Cl.
    H03F 3/38    (2006.01)
(52) U.S. Cl. .................. 330/10; 330/207 A; 330/251
(58) Field of Classification Search .............. 330/10, 330/207 A, 251
    See application file for complete search history.

(56) References Cited

U.S. PATENT DOCUMENTS

| 4,531,096 | A  |   | 7/1985  | Yokoyama |
|-----------|----|---|---------|----------|
| 6,249,182 | B1 | * | 6/2001  | Pullen ............... 330/10 |
| 6,297,692 | B1 | * | 10/2001 | Nielsen .............. 330/10 |
| 6,300,825 | B1 |   | 10/2001 | Dijkmans et al. |
| 2001/0048345 | A1 |   | 12/2001 | Stanley |

FOREIGN PATENT DOCUMENTS

| EP | 1 187 326 | 3/2002 |
| JP | 56 39606 | 4/1981 |
| JP | 56039606 A | 4/1981 |
| JP | 61 039621 | 2/1986 |
| WO | WO 98/19391 A2 | 5/1998 |

OTHER PUBLICATIONS

Danz, George E; Class-D Audio II Evaluation Board (HIP4080AEVAL2); Announcement Intersil, Mar. 1996, pp. 1-16, XP002909138.

\* cited by examiner

*Primary Examiner*—Robert Pascal
*Assistant Examiner*—Hieu Nguyen
(74) *Attorney, Agent, or Firm*—Cantor Colburn LLP

(57) ABSTRACT

The invention relates to a self-oscillating circuit comprising comparator means (CM) comprising at least one input means (IM) and at least one output means (OM), at least one of said at least one output means (OM) is coupled to at least one of said at least one input means (IM) via at least one filtering means (FM), said at least one filtering means (FM) at least partly comprising demodulation means (DM), wherein said filtering means (FM) is of at least fifth order.

51 Claims, 17 Drawing Sheets

SELF-OSCILLATING POWER CIRCUIT

FIELD OF THE INVENTION

Figure 1A:
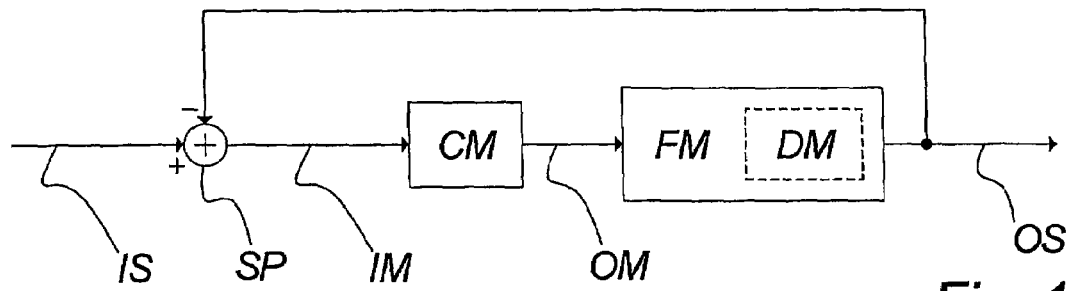

The present invention relates to self-oscillating circuits, in particular self-oscillating power amplifiers.

BACKGROUND OF THE INVENTION

For several years, PWM amplifiers have been used for power amplification in audio applications as they provide power amplification with a minimum of power loss. The PWM modulation and amplification means however introduces a relatively large amount of noise, errors and distortion making the use of PWM amplifiers only suitable for low-quality applications as e.g. PC-speakers, etc. Furthermore, the PWM modulation requires a very accurate saw-tooth or ramp signal to be present. Imperfections in that reference signal are directly projected as errors on the modulated audio signal.

An additional conventional PWM amplifier has been improved by establishing negative feedback from the output of the power stage back to the input of the modulator. Thereby, most of the errors and noise introduced by the modulation and power stages are suppressed. However, to obtain a usable utility bandwidth the switch frequency of the power stage has to be relatively high, which increases the noise and error introduced by the modulator and power switches. Also the loop filters have to be designed with care to avoid instability. This seriously limits the possible uses of the loop filters.

A further improved PWM amplifier utilizes controlled instability in the feedback loop to omit the reference signal and thereby causing a self-oscillating PWM amplifier. Thus, the possible errors of the reference signal have been avoided. Such self-oscillating PWM amplifier however still present several requirements to the design of the loop filters as the instability is often desired to arise at a certain frequency. Thus, only simple loop filters with limited open loop gain and thus limited noise suppression and relatively narrow utility bands have been provided with PWM amplifiers. Furthermore, subsequent demodulation means also introduces noise and distortion which is not suppressed.

One of several objects of the present invention is to provide a self-oscillating PWM amplifier with improved suppression of noise, distortion and error.

One of several objects is to provide a self-oscillating PWM amplifier with broadened utility bandwidth.

SUMMARY OF THE INVENTION

The present invention relates to a self-oscillating circuit comprising comparator means CM comprising at least one input means IM and at least one output means OM, at least one of said at least one output means OM is coupled to at least one of said at least one input means IM via at least one filtering means FM, said at least one filtering means FM at least partly comprising demodulation means DM, wherein said filtering means FM is of at least fifth order.

By implementing the filtering means as high order filters, enhanced control over the feedback frequency response, and the noise suppressing achieved by the feedback is obtained. The higher order, the higher utility band gain for a wider utility band is possible. Higher order furthermore enables less distance between the upper frequency $f_0$ of the utility frequency band and the switch frequency $f_{SW}$.

The order of a filter is considered as the number of poles appearing in the open loop characteristic of the circuit. Characteristic does here and in the following refer to the Laplace transformed transfer function.

The comparator means preferably comprises means for pulse width modulating a signal. In a self-oscillating circuit, this may be implemented as a comparator having one input coupled to a constant voltage, e.g. 0V, and the other input coupled to the incoming signal with the subtracted feedback signal. Which input, negative or positive, that is used for which signal is unimportant.

The filtering means may comprise any kind of digital or analogue passive or active filtering circuitry, together forming a high order filtering means.

The demodulation means may accordingly comprise any kind of digital or analogue passive or active filtering circuitry of any order. The demodulation means should be able to demodulate a PWM signal and is thus preferably a low-pass filter. The components used for implementing the demodulation means are in preferred embodiments of the invention low-loss power components.

According to a preferred embodiment of the present invention, the number of filter poles comprised by the characteristic of said filtering means FM is at least five, more preferably at least six and even more preferably at least seven.

A filter pole in this context is considered a root of the denominator polynomial of the filter characteristic. Moreover, the number of poles determines the order of the filter.

By introducing at least five, six or seven filter poles, the order of the filter is at least five, six or seven respectively. This makes it possible to obtain very good noise suppression, while maintaining a broad utility bandwidth and a sufficiently low switch frequency $f_{SW}$. Furthermore, the complexity of the filtering means may be kept relatively low.

According to an embodiment of the present invention, the number of filter poles comprised by the characteristic of said filtering means FM is at least eight, more preferably at least nine and even more preferably at least ten.

By introducing at least eight, nine or ten filter poles, the order of the filter is at least eight, nine or ten respectively. This makes it possible to obtain even better noise suppression while maintaining a broader utility bandwidth at a lower switch frequency $f_{SW}$. On the other hand, the implementation of the filtering means may become a little more complex.

According to an embodiment of the present invention, the number of filter poles comprised by the characteristic of said filtering means FM is at least eleven, more preferably at least twelve and even more preferably at least thirteen.

By introducing at least eleven, twelve or thirteen filter poles, the order of the filter is at least eleven, twelve or thirteen. Thereby, it is possible to obtain extremely good noise suppression and a very broad utility bandwidth while only relatively short distance is kept to the switch frequency $f_{SW}$. On the other hand, the complexity of the filtering means becomes relatively high.

It is noted that the higher the order, i.e. the more filter poles being added, the more ideal characteristic is obtainable. Thus, an infinite number of filtering poles enables the best possible filtering means and thus orders higher than thirteen are perfectly within the scope of the present invention.

According to a preferred embodiment of the present invention, the number of filter zeroes comprised by the characteristic of said filtering means FM is at least two, more preferably at least three and even more preferably at least four.

A filter zero is in this context considered a root of the numerator polynomial of the filter characteristic.

By introducing at least two, three or four filter zeros it is possible to compensate for at least two, three or four, respectively, of the poles in the open loop, or to apply a positive phase shift to reduce the cause of delays or poles. Moreover, filter zeroes may be used for filtering purposes in order to achieve a high utility band gain and thereby good noise suppression. With the number of filter zeroes comprised by this embodiment of the invention, a high degree of noise suppression and a broad utility bandwidth may be achieved with a relatively simple filtering means implementation.

According to an embodiment of the present invention, the number of filter zeroes comprised by the characteristic of said filtering means FM is at least five, more preferably at least six and even more preferably at least seven.

By introducing at least five, six or seven filter zeroes it is possible to compensate for five, six or seven, respectively, of the poles in the open loop, or to apply a positive phase shift to at least partly reduce the cause of delays or poles. Moreover, zeroes may be used for filtering purposes in order to achieve a high utility band gain and thereby good noise suppression. With the number of filter zeroes comprised by this embodiment of the invention an even higher degree of noise suppression and a broader utility bandwidth may be achieved but on the expense of filtering means implementation simplicity.

According to an embodiment of the present invention, the number of filter zeroes comprised by the characteristic of said filtering means FM is at least eight, more preferably at least nine and even more preferably at least ten.

By introducing at least eight, nine or ten filter zeroes it is possible to compensate for eight, nine or ten, respectively, of the poles in the open loop, or to apply a positive phase shift to at least partly reduce cause of delays and poles. Moreover, zeroes may be used for filtering purposes in order to achieve a high utility band gain and thereby good noise suppression. With the number of filter zeroes comprised by this embodiment of the invention, a very high degree of noise suppression and a broad utility bandwidth may be achieved by means of a relatively complex filtering means.

As the higher the order, i.e. the more filter poles being added, the more ideal characteristic is obtainable and accordingly a higher number of filter zeroes is needed. Thus, as an infinite number of filtering poles enables the best possible filtering means, this requires an infinite number of filter zeroes, i.e. more than ten filter zeroes are perfectly within the scope of the present invention.

According to a preferred embodiment of the present invention, the number of filter poles comprised by the characteristic of said filtering means FM exceeds the number of filter zeroes by three.

The most beneficial filtering means may be obtained by carefully balancing the number of zeroes in relation to the number of poles. As the phase shift should be negative, the number of poles should exceed the number of zeroes, preferably by three. As two non-cancelled poles cause a phase shift of −180°, three non-cancelled poles make the phase shift drop below −180° and thereby enable self-oscillation. Preferably, the poles and zeroes considered are only poles and zeroes having a certain influence on the switch frequency, utility band gain, etc. However, it is noted that any number of filter poles in relation to the number of filter zeroes are within the scope of the present invention.

According to an embodiment of the present invention, at least one of said filter zeroes comprised by the characteristic of said filtering means FM cancels at least one of said filter poles.

By locating a filter zero at the same frequency as a filter pole, it is possible to at least partly cancel its effect. Thereby, a filter pole that for some reason is located at a non-optimal frequency may have its effect cancelled by means of a properly positioned filter zero.

According to a preferred embodiment of the present invention, the location of at least one of said filter zeroes is determined on the basis of the location of at least one of said filter poles.

By positioning a filter zero properly in relation to a filter pole it is possible to partly cancel its effect and thereby achieve a kind of diminished pole or zero effect at that frequency. Hence, by pairing filter zeroes with filter poles in this way a very accurate control of the phase shift and amplitude may be obtained.

According to a preferred embodiment of the present invention, the location of each of said filter zeroes is determined on the basis of the locations of said filter poles.

By pairing all filter zeroes with filter poles as described above, it is possible to establish a certain desired phase shift at a relatively low frequency, i.e. in the lower end of the utility band, and keep that specific phase shift up to the upper end of the utility band. As the characteristic preferably comprises three more filter poles than filter zeroes, placing one of these below the pole-zero pairs and the last two above the pole-zero pairs enable a very high degree of control. A very broad utility band, large utility bands gain and shorter distance between the upper frequency of the utility band and the switch frequency may be obtained by this embodiment of the present invention.

According to an embodiment of the present invention, said self-oscillating circuit oscillates at a switch frequency $f_{SW}$ higher than the upper frequency $f_0$ of a utility frequency band.

By ensuring that the switch frequency is always higher than the upper frequency of the utility band, the oscillating signal component may not interfere with the utility signal component in a considerable scale.

According to an embodiment of the present invention, said utility frequency band is the audio band.

As a PWM amplifier embodiment of the present invention is exceptionally well suited for audio power amplification, a utility band comprising the audio band is desired.

According to a preferred embodiment of the present invention, said utility frequency band comprises frequencies in the range of 0 Hz to 100 kHz.

By enabling a very broad utility band, the self-oscillating amplifier may be used for numerous purposes, including not only audio applications.

According to an embodiment of the present invention, said utility frequency band comprises frequencies in the range of 0 Hz to 60 kHz.

By enabling a very broad utility band, the self-oscillating amplifier may be used for numerous purposes, including not only audio applications.

According to an embodiment of the present invention, said utility frequency band comprises frequencies in the range of 20 Hz to 20 kHz.

As a PWM amplifier embodiment of the present invention is exceptionally well suited for audio power amplification, a utility band comprising the audio band is desired.

According to a preferred embodiment of the present invention said self-oscillating circuit comprises a switch mode amplifier AM.

By incorporating a switch mode amplifier an extremely simple and effective means for amplifying the PWM signal is obtained. Thus, the present invention may easily be adapted for any purpose comprising small-signal amplification and power amplification. The switch mode amplifier may be of any suitable kind, e.g. single-ended, having differential output, etc.

According to a preferred embodiment of the present invention said switch frequency $f_{SW}$ is at least partly determined by means of said filter poles and said filter zeroes.

The switch frequency is determined by the phase shift through the open loop. By changing the phase shift, e.g. by adding poles and zeroes, compensating for poles or zeroes, changing their location and adding delay, the switch frequency may be controlled.

According to an embodiment of the present invention, the phase margin of the open loop characteristic for frequencies within a frequency band having a lower frequency of one tenth of said switch frequency $f_{SW}$ and an upper frequency of said switch frequency $f_{SW}$ is between 0° and 60°.

By the phase margin of a filter characteristic is referred to the angle that the phase shift lacks relative to −180°. Thus, if at a certain frequency the phase shift of a filter characteristic is −150°, the phase margin at that frequency is −150°−−180°=30°. The phase margin conception is e.g. used to indicate instability issues.

In order to obtain the highest possible open loop gain for low frequencies and thereby the best suppression of noise and distortion, the gain curve should break at the lowest frequency possible and have the steepest slope possible. Such behaviour may be obtained by placing poles at low frequencies but as each pole cause a phase shift of −90° and the phase shift has to stay above −180°, i.e. the phase margin has to be more than 0° up to the desired switch frequency $f_{SW}$, the number of poles has to be less than two. Consequently, only one pole may be placed at low frequencies without compensation thereby causing a phase margin of about 90° at frequencies below the switch frequency $f_{SW}$. This again limits the slope of the gain to be a first order-like slope and in turn limits the possible open loop gain.

It is, however, possible by means of the high order filtering means FM of an embodiment of the present invention to obtain a filter characteristic with a phase margin smaller than 60° and thereby a steeper open loop gain slope which in turn means an extended highest possible open loop gain.

According to an embodiment of the present invention, the phase margin of the open loop characteristic for frequencies within a frequency band having a lower frequency of one tenth of said switch frequency $f_{SW}$ and an upper frequency of said switch frequency $f_{SW}$ is between 0° and 45°.

It is possible by means of the high order filtering means FM of an embodiment of the present invention to obtain a filter characteristic with a phase margin smaller than 45° and thereby a steeper open loop gain slope which in turn means an extended highest possible open loop gain.

According to a preferred embodiment of the present invention, the phase margin of the open loop characteristic for frequencies within a frequency band having a lower frequency of one tenth of said switch frequency $f_{SW}$ and an upper frequency of said switch frequency $f_{SW}$ is between 0° and 30°.

It is possible by means of the high order filtering means FM of a preferred embodiment of the present invention to obtain a filter characteristic with a phase margin smaller than 30° and thereby a steeper open loop gain slope which in turn means an extended highest possible open loop gain.

According to an embodiment of the present invention, the gain of the open loop characteristic at a frequency of one hundredth of said switch frequency $f_{SW}$ exceeds the gain at said switch frequency $f_{SW}$ by at least 50 dB.

In order to obtain the highest possible open loop gain for low frequencies and thereby the best suppression of noise and distortion, the gain curve should break at the lowest frequency possible and have the steepest slope possible. Such behaviour may be obtained by placing poles at low frequencies but as each pole cause a phase shift of −90° and the phase shift has to stay above −180°, i.e. the phase margin has to be more than 0° up to the desired switch frequency $f_{SW}$, the number of poles have to be less than two. Consequently, only one pole may be placed at low frequencies without compensation thereby causing the slope of the gain to be a first order-like slope that on the average decreases about 20 dB per decade and thus limits the possible open loop gain.

It is, however, possible by means of the high order filtering means FM of an embodiment of the present invention to obtain a filter characteristic with a gain between the low frequency pole and the switch frequency that on the average decreases more than 25 dB per decade and thereby an extended highest possible open loop gain.

According to an embodiment of the present invention, the gain of the open loop characteristic at a frequency of one hundredth of said switch frequency $f_{SW}$ exceeds the gain at said switch frequency $f_{SW}$ by at least 60 dB.

It is, however, possible by means of the high order filtering means FM of an embodiment of the present invention to obtain a filter characteristic with a gain between the low frequency pole and the switch frequency that on the average decreases more than 30 dB per decade and thereby an extended highest possible open loop gain.

According to a preferred embodiment of the present invention, the gain of the open loop characteristic at a frequency of one hundredth of said switch frequency $f_{SW}$ exceeds the gain at said switch frequency $f_{SW}$ by at least 70 dB.

It is however possible by means of the high order filtering means FM of a preferred embodiment of the present invention to obtain a filter characteristic with a gain between the low frequency pole and the switch frequency that on the average decreases more than 35 dB per decade and thereby an extended highest possible open loop gain.

According to an embodiment of the present invention, the characteristic of said filtering means FM comprises additional auxiliary filter poles or zeroes.

As the main issue of the present invention is to obtain the highest possible open loop gain in a self-oscillating circuit with proper consideration for bandwidth, switch frequency, etc., only filter poles and filter zeroes that actually have an effect on these issues are relevant for the present invention. Thus, filter poles and filter zeroes forming part of the filtering means for reasons irrelevant to the above-mentioned issues and which do not affect the open loop gain, the switch frequency, the phase margin, etc., in a significant way, may be considered additional auxiliary filter poles or zeroes and may not be counted in when considering order of the filtering means, the number of filter poles and filter zeroes, the location or pairing of filter poles and filter zeroes, or other of the important and claimed issues for this invention.

As poles or zeroes placed at a certain distance above the switch frequency, e.g. one decade above, do not have any impact on the location of the switch frequency, the open loop gain, etc., they may be considered additional auxiliary filter poles or zeroes. This also applies to the many parasitic poles and zeroes that are actually inherited with more sophisticated components as e.g. operational amplifiers, etc., but are not dominantly enough to cause any impact.

Moreover, filter poles and filter zeroes may be inserted below the switch frequency for several reasons not related to the issues of the present invention. If such filter poles and filter zeroes have actually no significant influence on the issues that are important to the present invention, they also may be considered additional auxiliary filter poles or zeroes.

According to an embodiment of the present invention, said upper frequency $f_0$ of said utility frequency band is determined as the break frequency of said demodulation means DM.

According to an embodiment of the present invention, the characteristic of said demodulation means DM comprises at least one filter pole.

Thereby, the demodulation means is at least a first order filter. Such a filter may be implemented as e.g. a single coil. Higher order filters however, involve more complexity and probably more power loss but also better demodulation and noise suppression.

As according to an embodiment of the invention, the filtering means FM may comprise only partly the demodulation means DM, the demodulation means may actually be of a higher order, e.g. second order, but only contribute to the filtering means with one filter pole. This may, e.g., be implemented by feeding back the current through the coil, instead of the voltage on the output of the coil.

According to a preferred embodiment of the present invention, the characteristic of said demodulation means DM comprises at least two filter poles.

Thereby, the demodulation means is at least a second order filter. Such a filter may be implemented as e.g. a coil and a capacitor, which are preferred implementations as these components are available as low-loss power components and also performs demodulation satisfactory. Higher order filters involve more complexity and probably more power loss but also better demodulation and noise suppression.

According to an embodiment of the present invention, said filtering means FM comprises at least one feedback filtering means FFM and at least one compensation filtering means CFM.

By in addition to the demodulation means splitting the filtering means into a feedback filtering means and a compensation filtering means, an advantageously way of implementing the filtering means has been obtained. Thus, the filtering means may be placed at different positions within the circuit, to utilize the characteristics of different positions, such as e.g. the reciprocal effect caused by placing a block in the feedback path when considering the closed loop transfer function. Preferably the feedback filtering means FFM may be placed in a feedback path, and the compensation filtering means CFM prior to the comparator means CM, as the signals there, as opposed to the signals subsequent to the demodulation means DM are small signals.

According to an embodiment of the present invention, said self-oscillating circuit comprises at least two feedback paths.

Thereby it is made possible to obtain advanced filtering effects, such as e.g. complex conjugate pole or zero pairs, with less components and complexity. Moreover two or more feedback paths facilitate stability, as a filter element that for some reason, e.g. an external parameter that changes unexpectedly, attempts to cause instability, will probably not have sufficient dominance to pull the additional parallel feedback paths with it, and thereby cause the whole circuit to be instable. In an embodiment of the present invention, two feedback paths are thus picked off before and after the demodulation means, respectively, and thereby instability that may be caused by removing the load from the demodulation means has been avoided, as the feedback path not comprising the demodulation means will reject the instability tendency in the other path. However, this also requires the ratio between the gains of each of the feedback paths to be within a certain interval, depending on the character of the possible instability.

According to a preferred embodiment of the present invention, said self-oscillating circuit comprises a first feedback path comprising at least partly said demodulation means DM, a first feedback filtering means FFFM and a first compensation filtering means FCFM, and an additional feedback path comprising an additional feedback filtering means AFFM and an additional compensation filtering means ACFM.

By converting the filtering means into demodulation means, first feedback filtering means and first compensation means placed in a first feedback path, and additional filtering means and additional compensation filtering means placed in an additional feedback path, an advantageous method of controlling the switch frequency, the utility band gain and the utility bandwidth has been obtained.

Thereby is gained the advantages of both distributing the filtering blocks along the circuit to utilize position dependent characteristics, and establishing two feedback paths to easily obtain advanced filtering effects.

According to an embodiment of the present invention, said additional feedback path at least partly comprises said demodulation means DM.

By picking off the additional feedback path within or subsequent to the demodulation means, the additional feedback path may contribute to the suppression of noise introduced by the demodulation means.

According to an embodiment of the present invention, said comparator means CM comprises a hysteresis comparator.

By applying hysteresis within the comparator means, an additional way of causing phase shift has been obtained.

According to a preferred embodiment of the present invention, said switch mode amplifier AM comprises two switches.

A preferred switch mode amplifier to use with the present invention comprises two switches, to establish positive and negative supply voltage on the output respectively.

If the switch mode amplifier is of a differential output type, it preferably comprises four switches.

According to a preferred embodiment of the present invention, said switch mode amplifier AM is a power amplifier.

As the present invention may be used exceptionally advantageously for audio applications, a preferred embodiment features a switch mode power amplifier.

According to a preferred embodiment of the present invention, said switch mode amplifier AM comprises MOSFET transistors.

As MOSFET transistors are exceptionally well suited for power purposes, and fast switching as well, they are the preferred switch components to use with the present invention.

According to a preferred embodiment of the present invention, said demodulation means DM is a low-pass filter.

As even a simple low-pass filter may sufficiently fulfil the demodulation requirements, it is a preferred demodulation means implementation.

Moreover a low-pass filter is a preferred implementation of the demodulation means because of EMC-considerations, as unnecessary high-frequency components on the output of the self-oscillating circuit may cause trouble subsequently, or not comply with requirements or regulations.

A further reason for using a low-pass filter for demodulation is that because of the output load, e.g. a speaker, often being a nonlinear component, high frequency signal components may distort utility band signal components due to intermodulational distortion.

According to an embodiment of the present invention, said demodulation means DM comprises auxiliary circuitry.

Except for the very demodulating components, the demodulation means DM may comprise means for other output stage related handling.

According to an embodiment of the present invention, said auxiliary circuitry comprises means for protecting said self-oscillating circuit.

An advantageous embodiment of the invention features auxiliary circuitry that protects the self-oscillating circuit from a non-load situation. Other circuit protecting means are within the scope of the present invention, e.g. short circuit protection, protection from an accidentally applied voltage, etc.

According to an embodiment of the present invention, said auxiliary circuitry comprises a Zöbel network.

A Zöbel network is an advantageous way of obtaining protection from a non-load situation.

According to an embodiment of the present invention, said auxiliary circuitry comprises means for impedance matching.

Thereby it is possible to adapt the self-oscillating circuit to precisely fit a certain subsequent circuit or load.

According to an embodiment of the present invention, said switch frequency $f_{SW}$ is comprised by the frequency band from 100 kHz to 100 MHz, more preferably the frequency band from 300 kHz to 1 MHz.

The switch frequency should be sufficiently high to not disturb the utility band, and more important, to enable a high open loop gain in the utility band. In power amplification embodiments, the possible switch frequency is tightly related to the available switches. As faster switches are developed, the switch frequency may be raised accordingly.

According to an embodiment of the present invention, said first feedback filtering means FFFM is a high-pass filter.

According to an embodiment of the present invention, said first feedback filtering means FFFM comprises a zero at the upper frequency $f_0$ of the utility frequency band.

Thereby a pole of the demodulation means is cancelled.

According to an embodiment of the present invention, said first compensation filtering means FCFM is a phase-lag filter.

According to an embodiment of the present invention, said first compensation filtering means FCFM comprises a pole at a low frequency $f_{DC}$, a zero at the upper frequency $f_0$ of the utility frequency band and a pole at the switch frequency $f_{SW}$.

As a phase-lag filter applies a phase shift of 0° seen over the full band, such a filter may advantageously be used to perform additional amplitude characteristic adaptations, without interfering significantly with the phase. Alternatively or additionally a phase-lag filter may be used to apply a certain phase shift at a certain frequency, as moving back and forth the poles and zeroes of a phase-lag filter may cycle the phase shift between 0°, −90° and back to 0°.

According to an embodiment of the present invention, said additional feedback filtering means AFFM is a low-pass filter.

According to an embodiment of the present invention, said additional feedback filtering means AFFM comprises a pole at the upper frequency $f_0$ of the utility frequency band.

By implementing the additional feedback filtering means as a low-pass filter, with the same break frequency as the demodulation means, the additional feedback filtering means may act as a sort of demodulator to the additional feedback path, that preferably does not comprise demodulation means. Furthermore, as there is a reciprocal relationship between the feedback filter characteristic in an open loop view and a closed loop view, a pole at this position will act as a zero in the closed loop characteristic.

According to an embodiment of the present invention, said additional compensation filtering means ACFM is a phase-lag filter.

According to an embodiment of the present invention, said additional compensation filtering means ACFM comprises a pole at a low frequency $f_{DC}$, a zero at the upper frequency $f_0$ of the utility frequency band and a pole at the switch frequency $f_{SW}$.

As a phase-lag filter applies a phase shift of 0° seen over the full band, such a filter may advantageously be used to perform additional amplitude characteristic adaptations, without interfering significantly with the phase. Alternatively or additionally a phase-lag filter may be used to apply a certain phase shift at a certain frequency, as moving back and forth the poles and zeroes of a phase-lag filter may cycle the phase shift between 0°, −90° and back to 0°.

According to an embodiment of the present invention said switch mode amplifier AM is of a differential output type.

Using such type of switch mode amplifier makes it possible to use the present invention with a uni-polar power supply, e.g. 0V to 5V or 0V to 100V, as opposed to using a bipolar power supply.

THE DRAWINGS

Figure 1B:
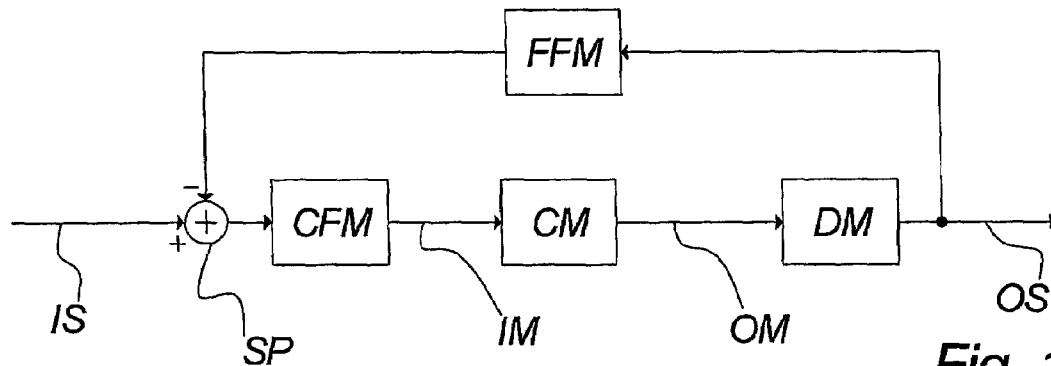
Figure 1C:
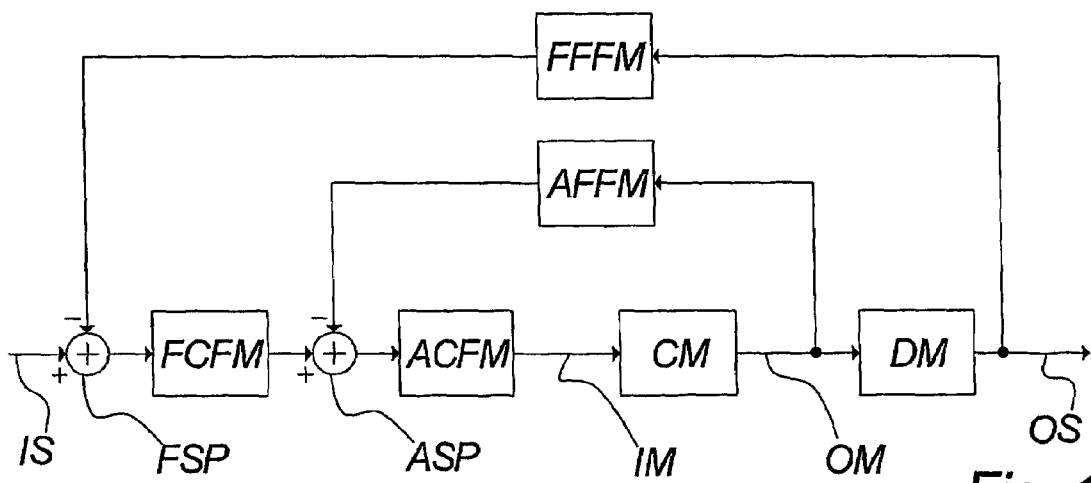
Figure 2A:
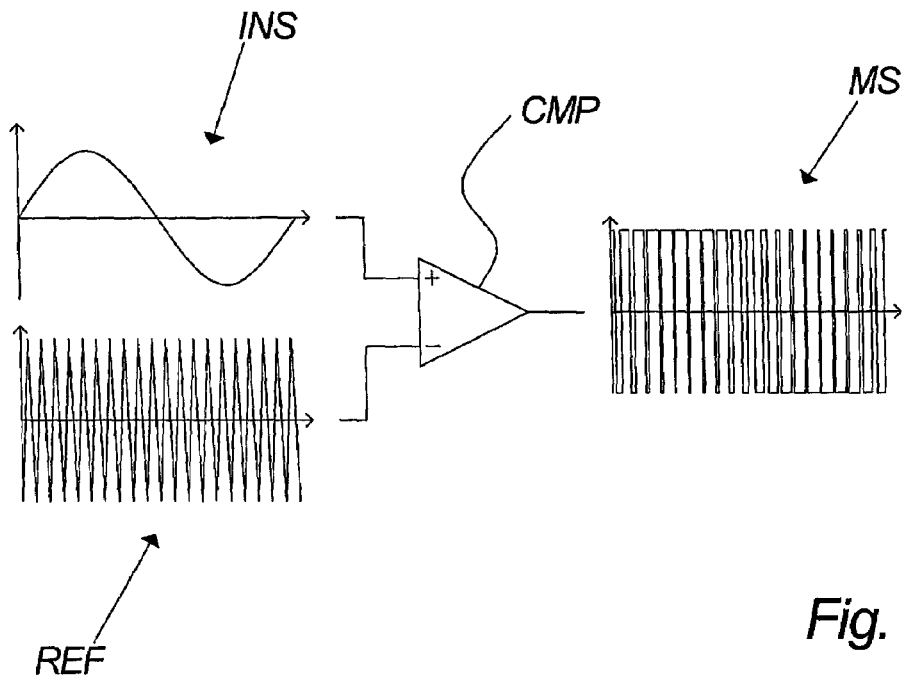
Figure 2B:
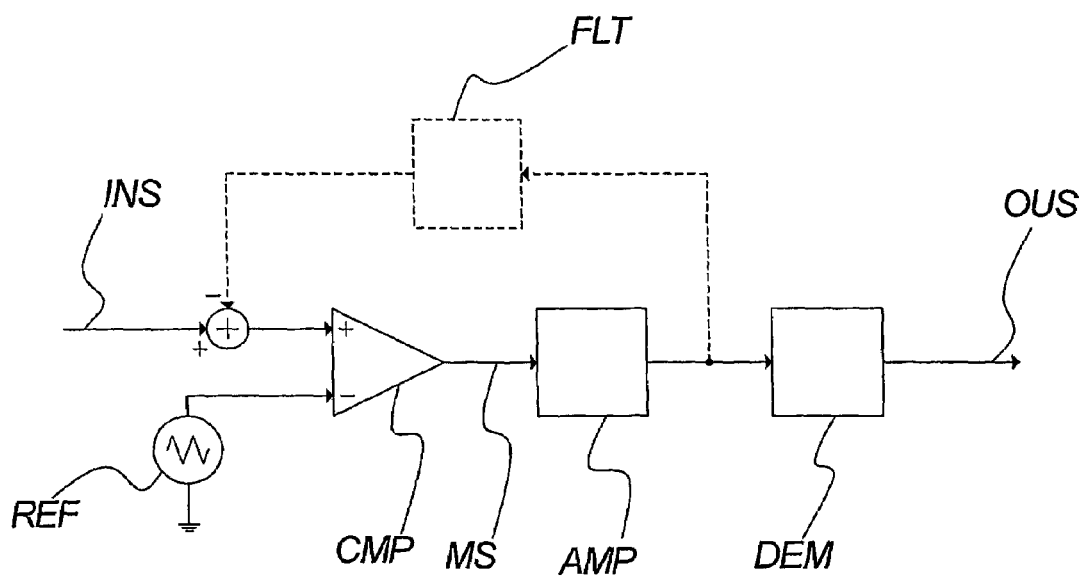
Figure 3A:
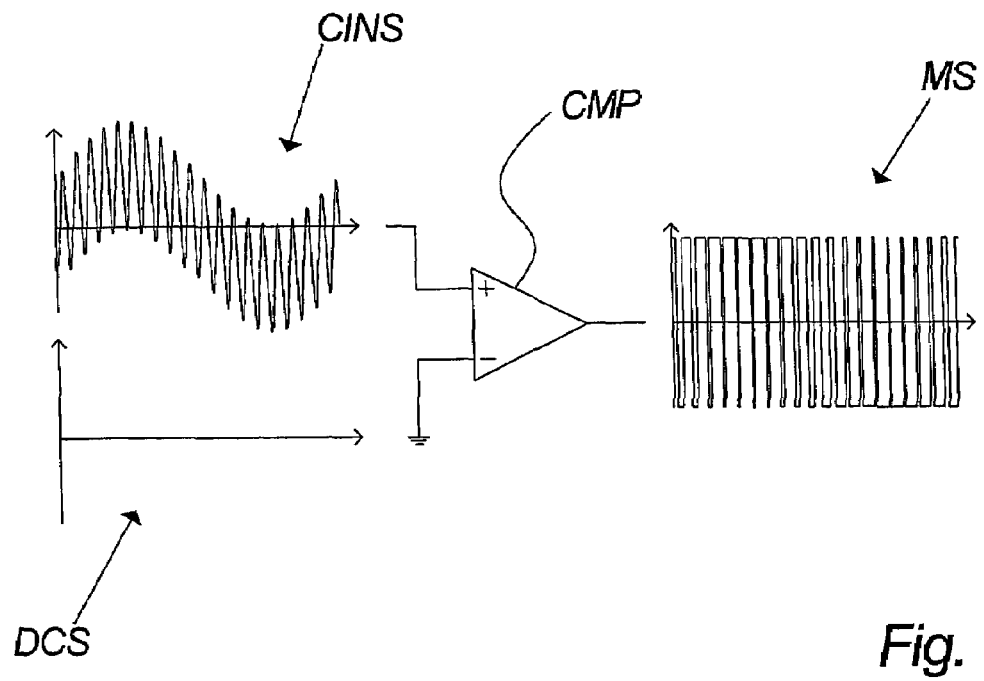
Figure 3B:
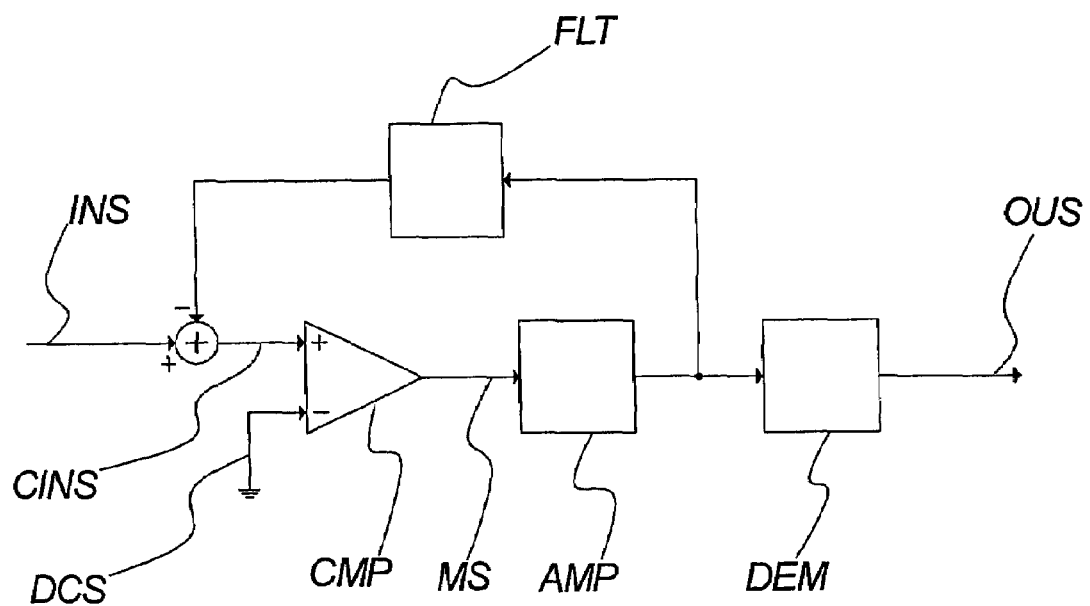
Figure 4A:
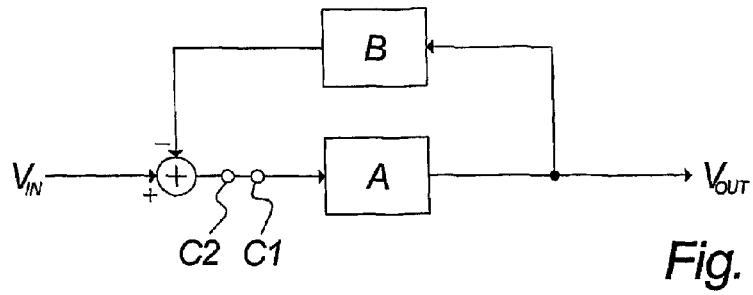
Figure 4B:
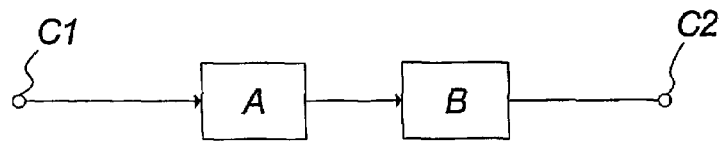
Figure 5:
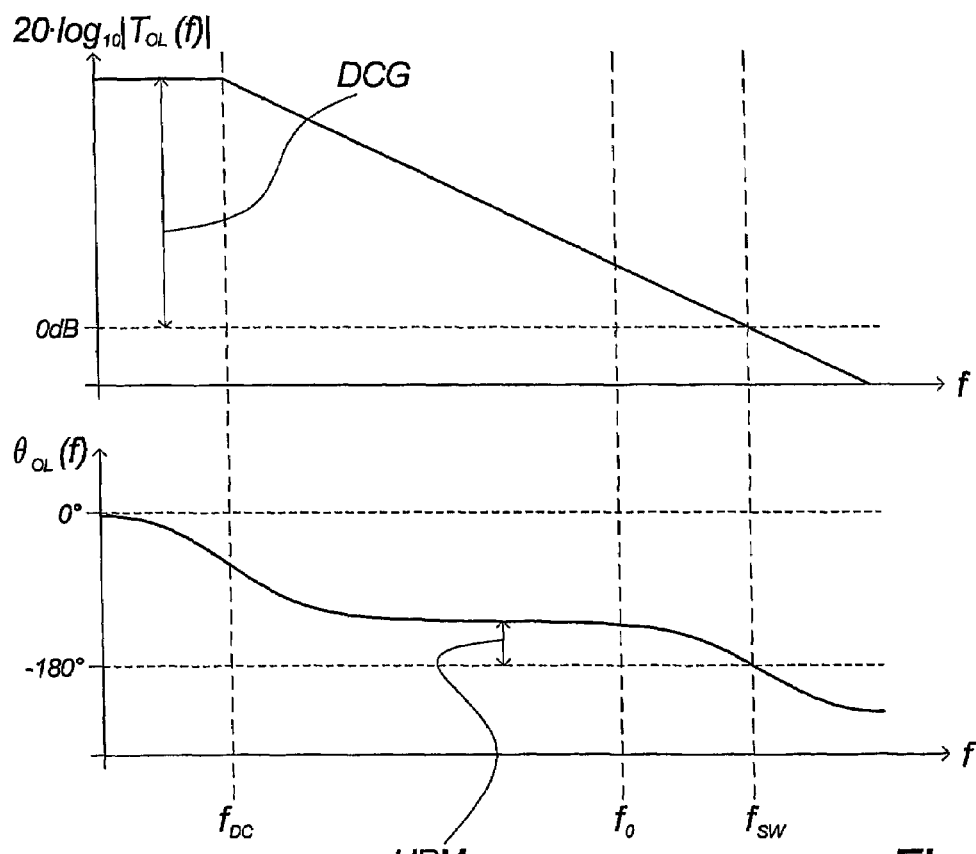
Figure 6A:
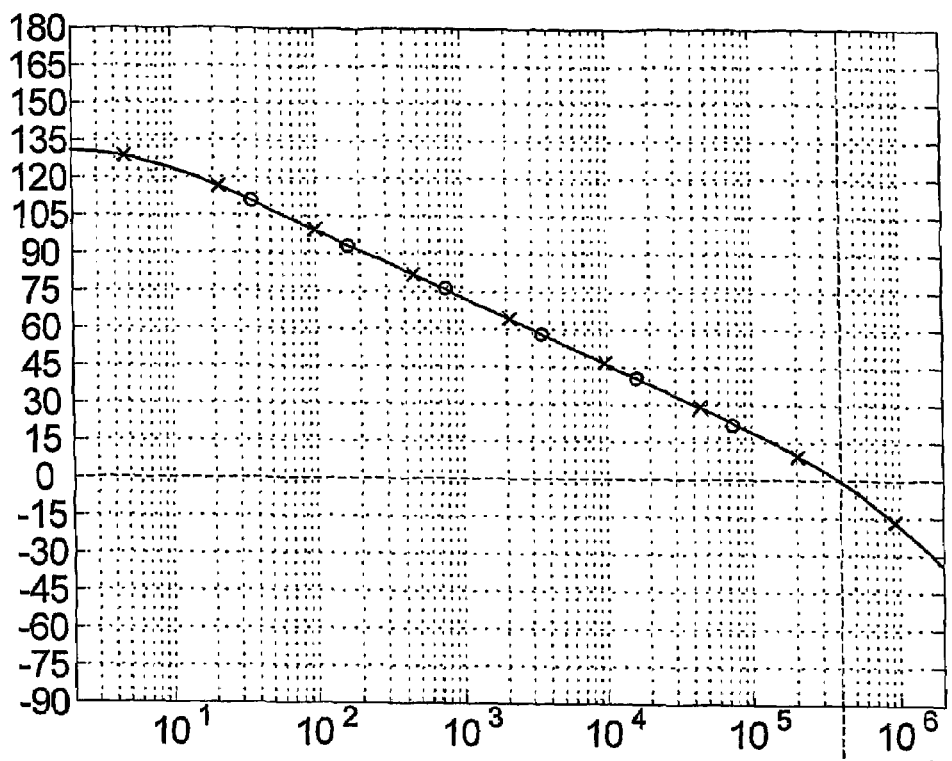
Figure 6B:
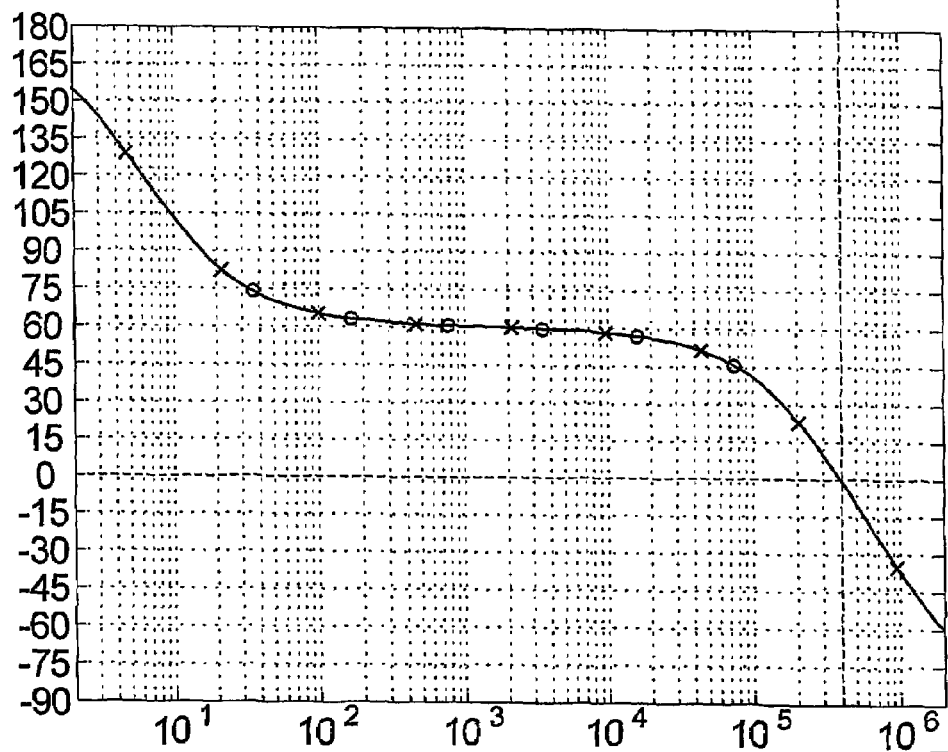
Figure 7A:
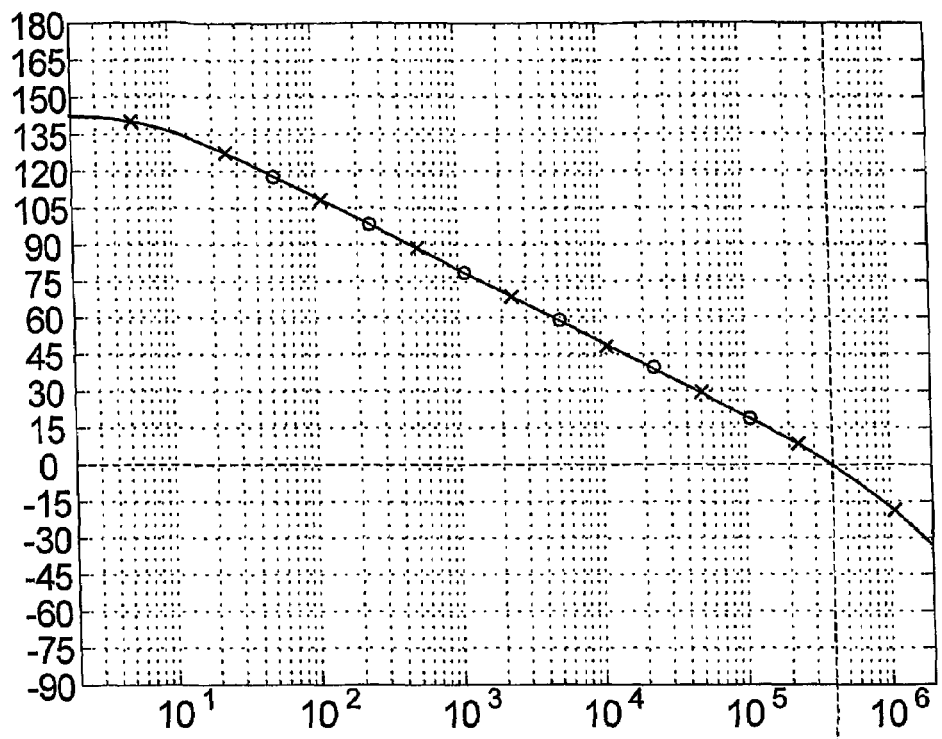
Figure 7B:
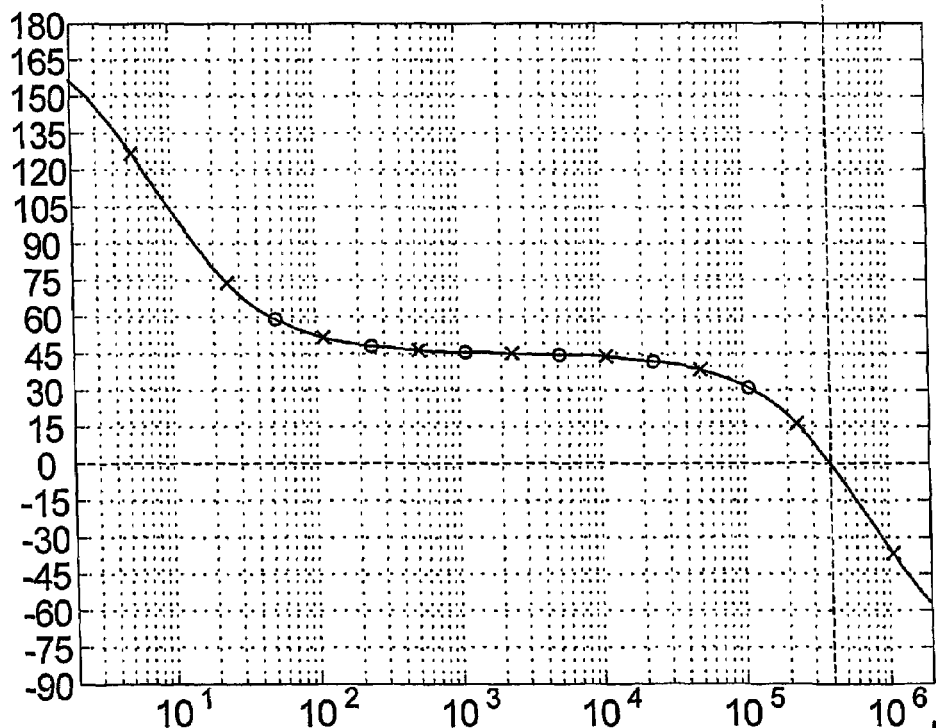
Figure 8A:
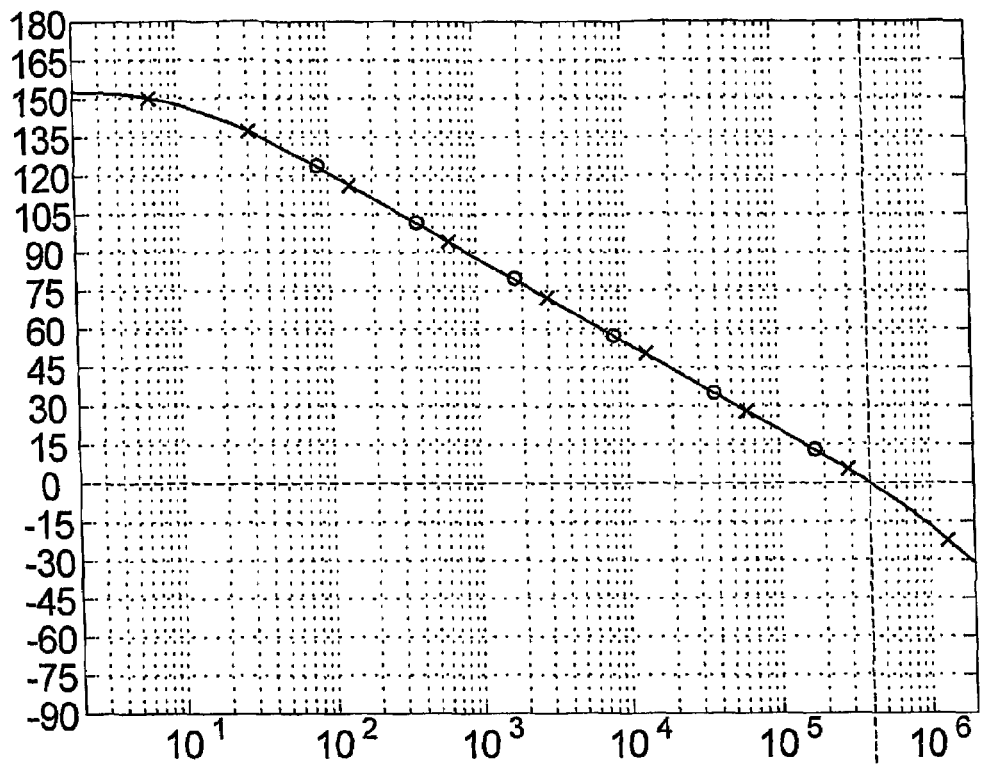
Figure 8B:
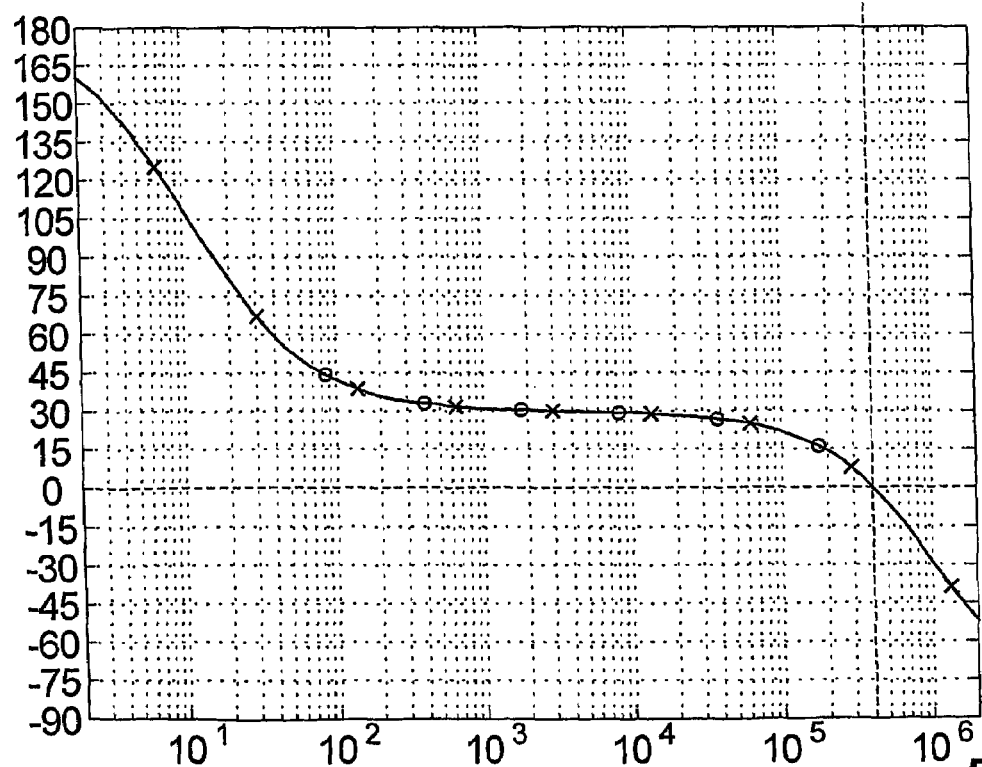
Figure 9A:
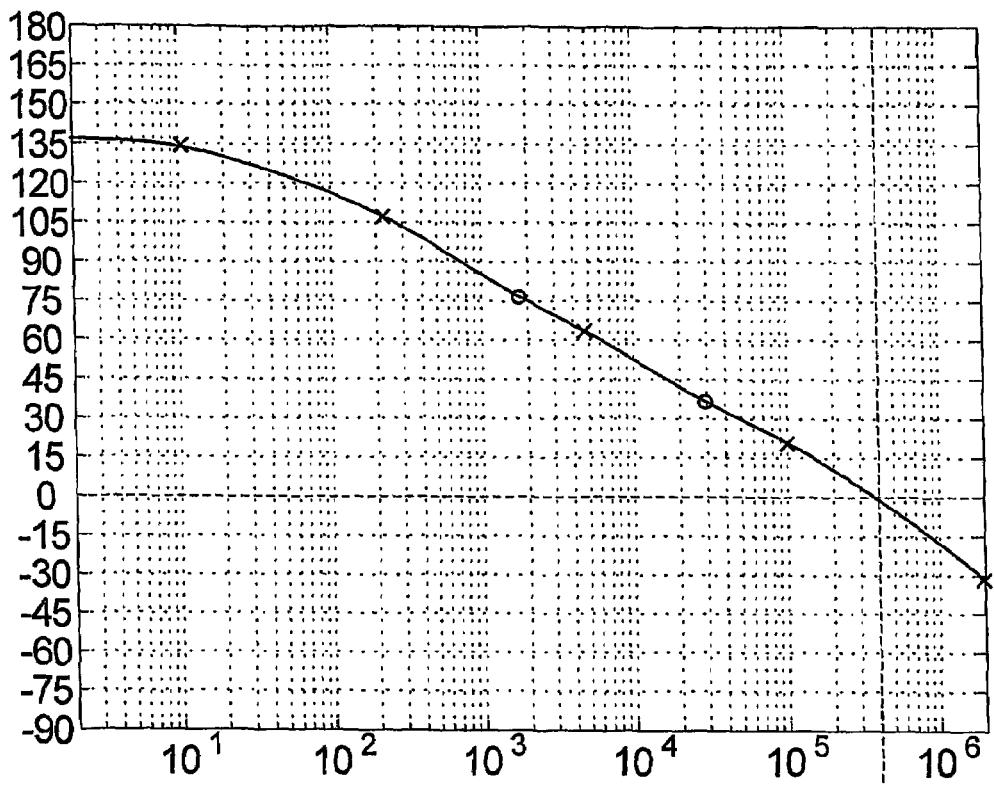
Figure 9B:
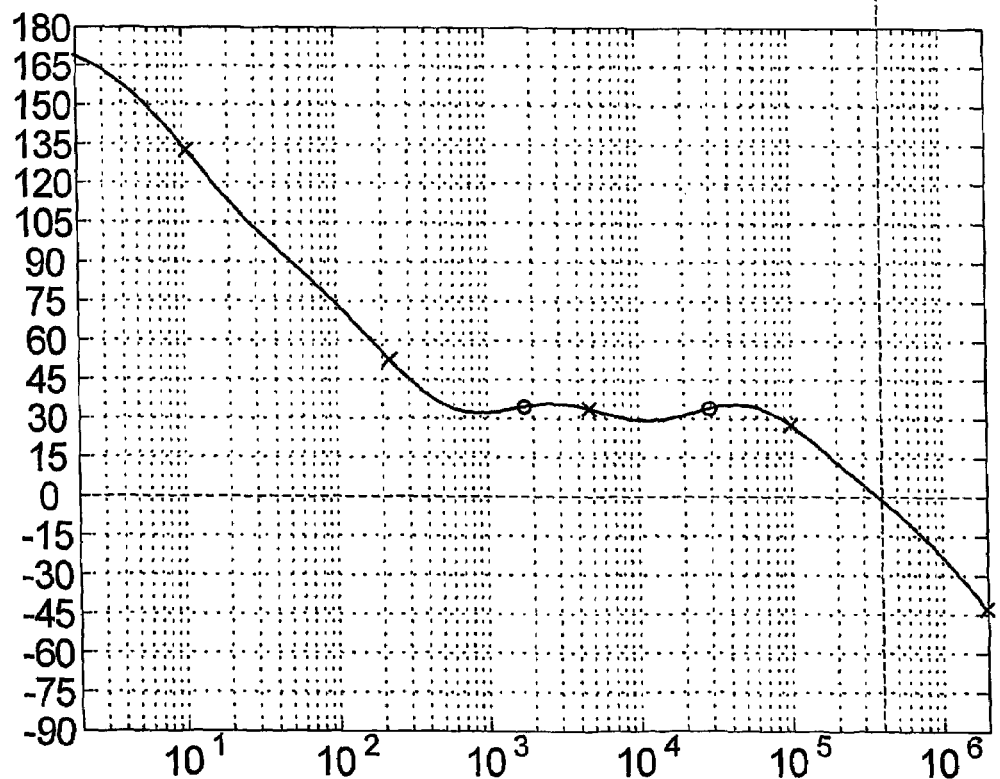
Figure 10:
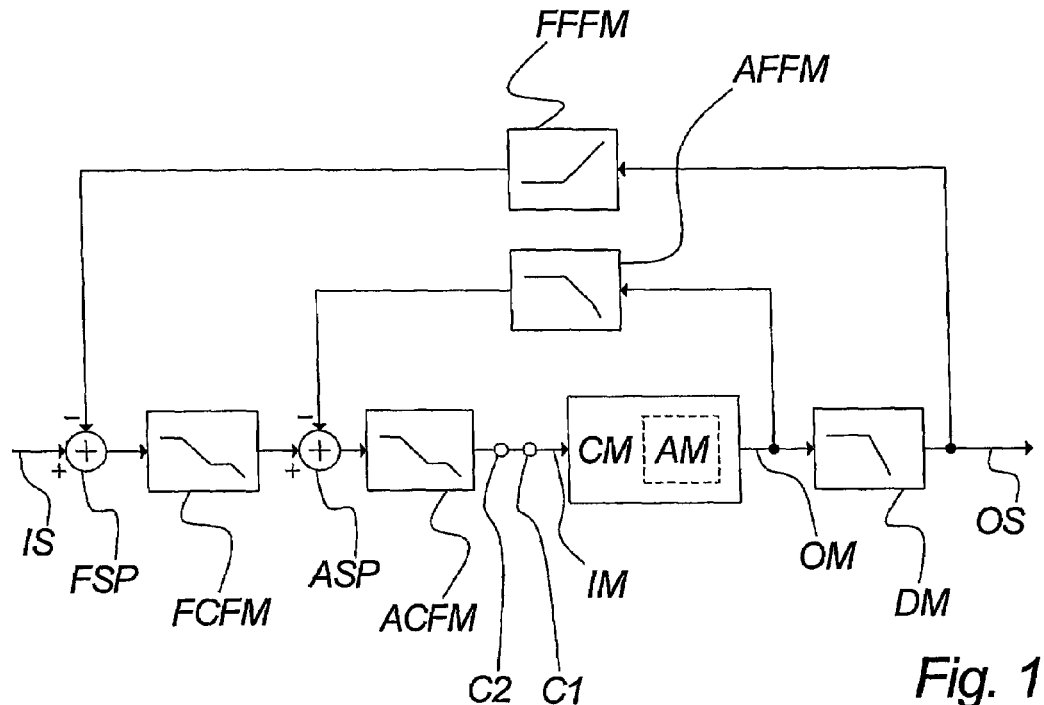
Figure 11:
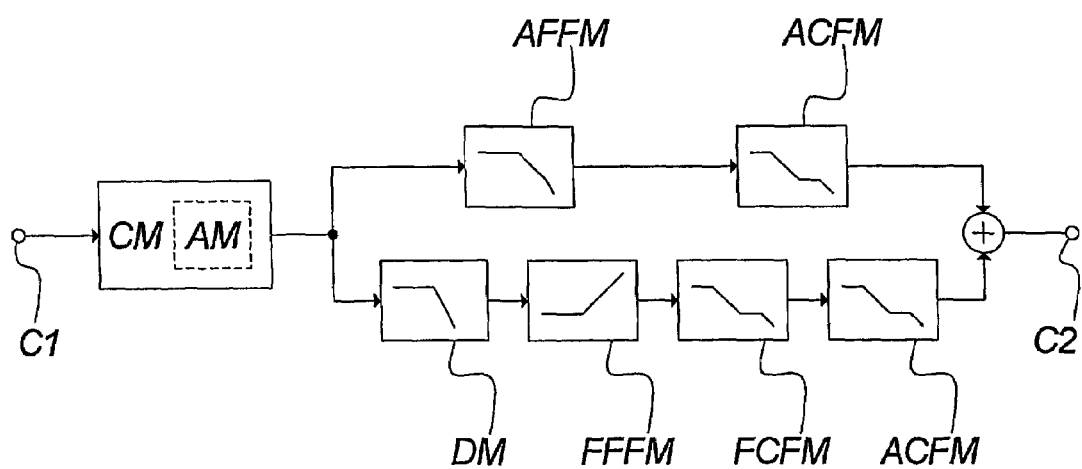
Figure 12:
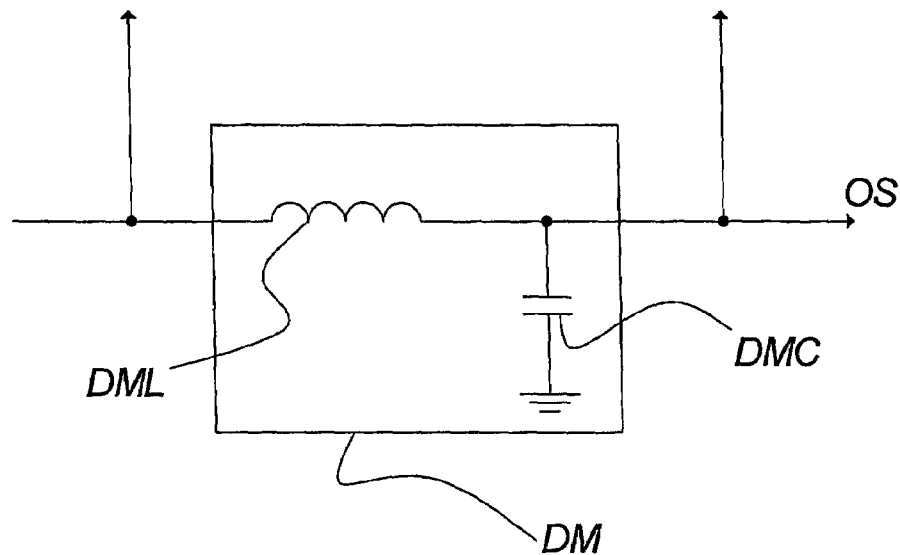
Figure 13:
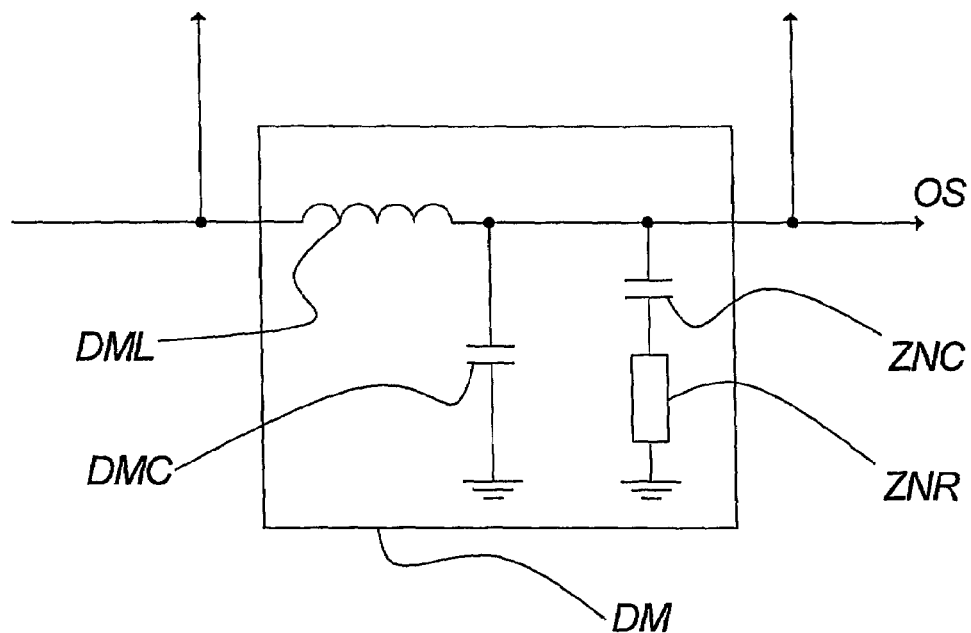
Figure 14:
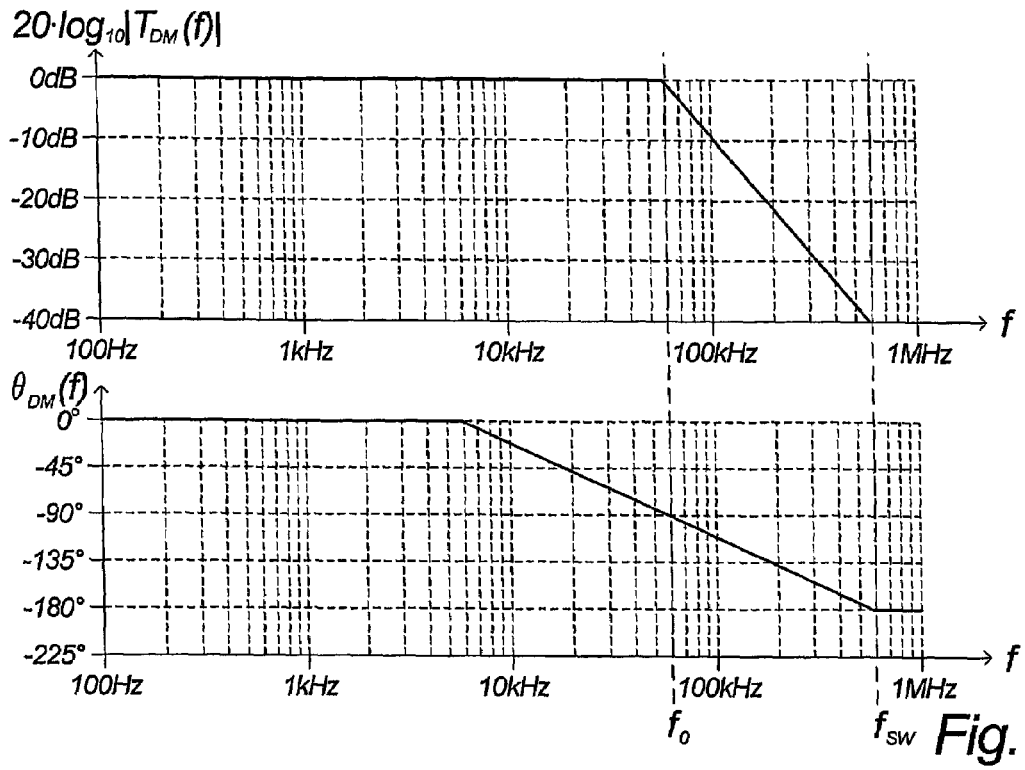
Figure 15:
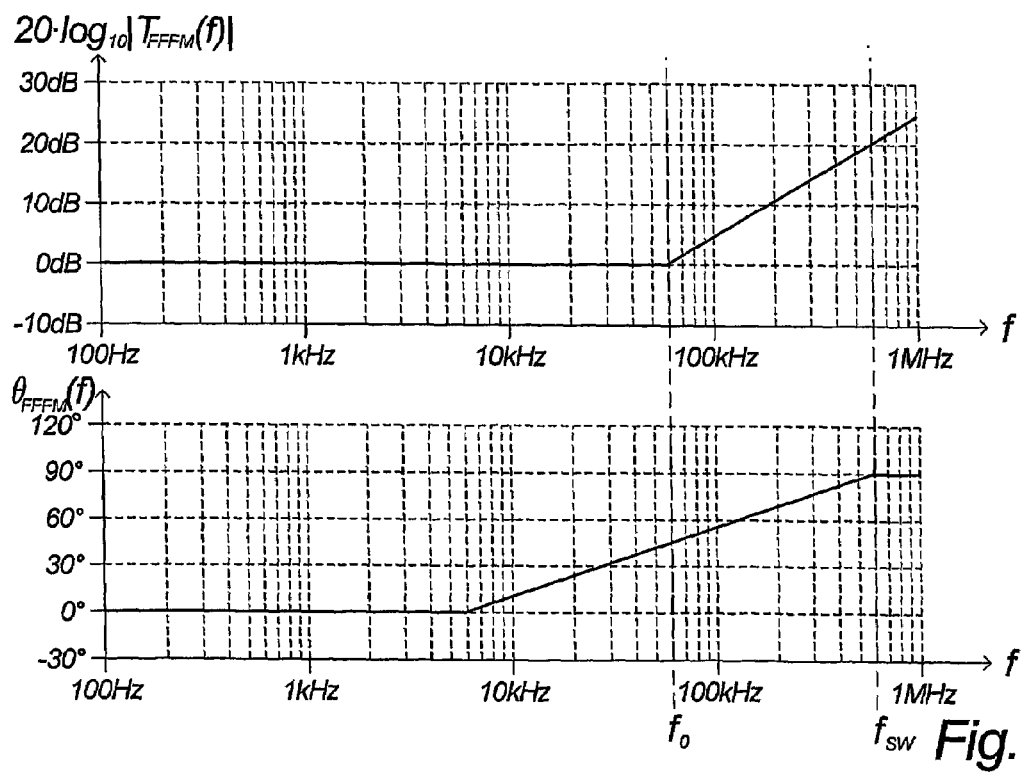
Figure 16:
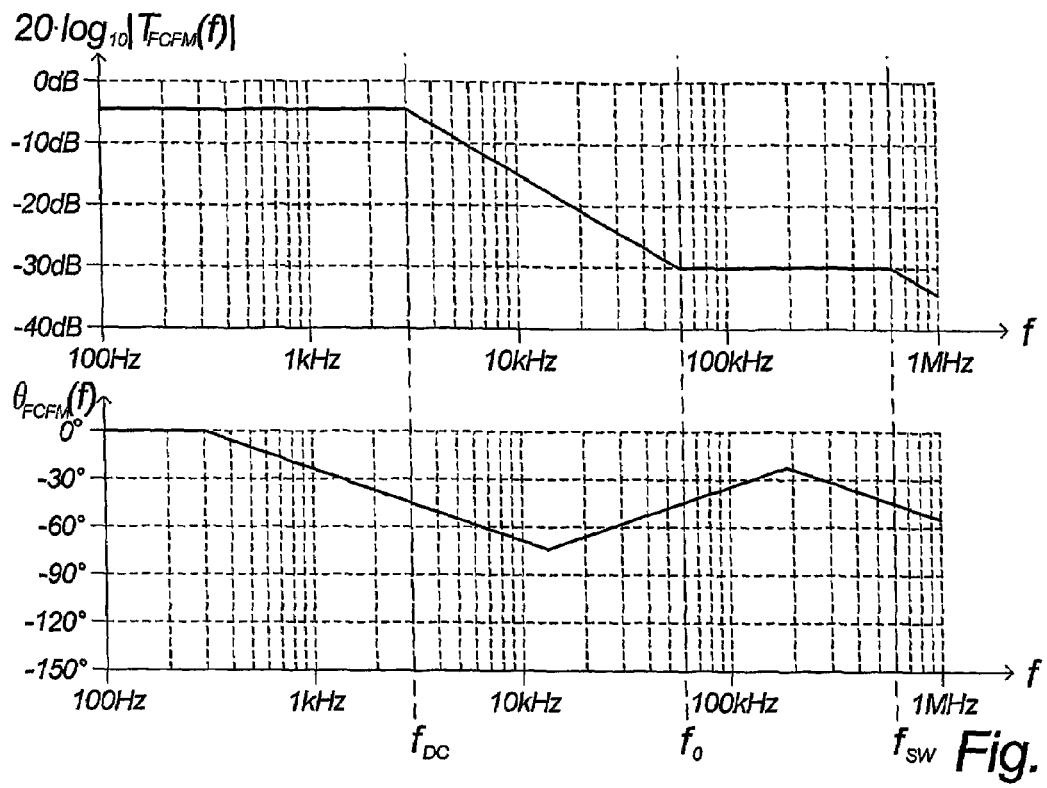
Figure 17:
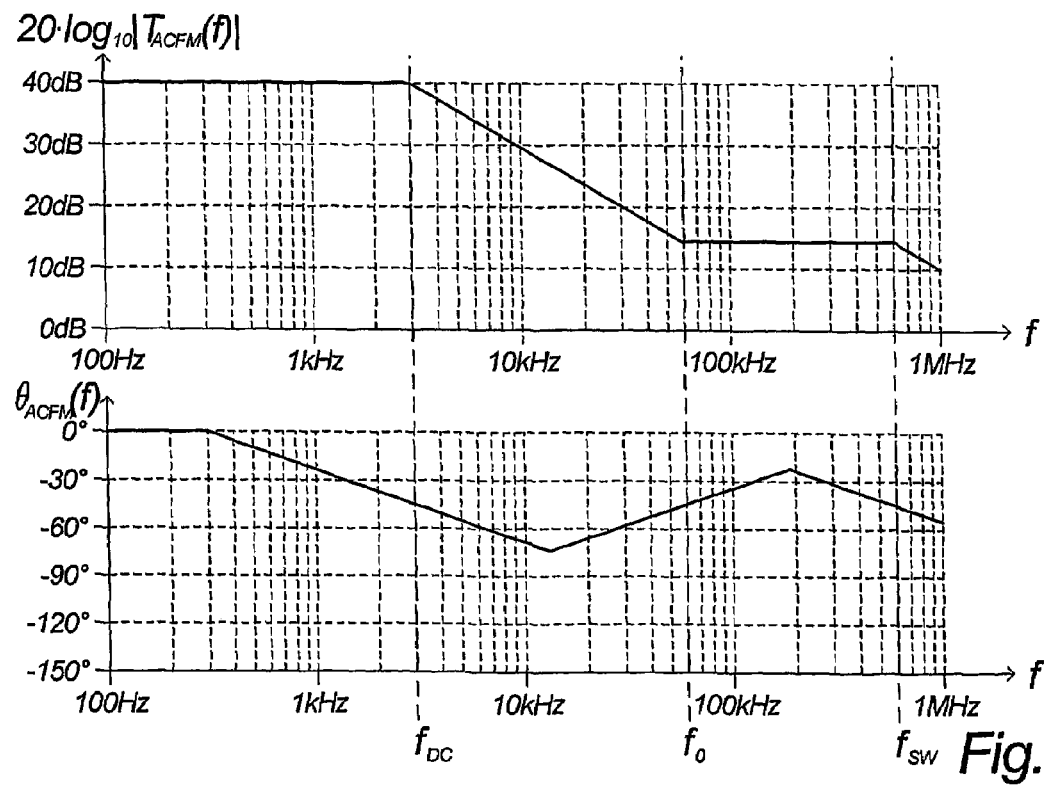
Figure 18:
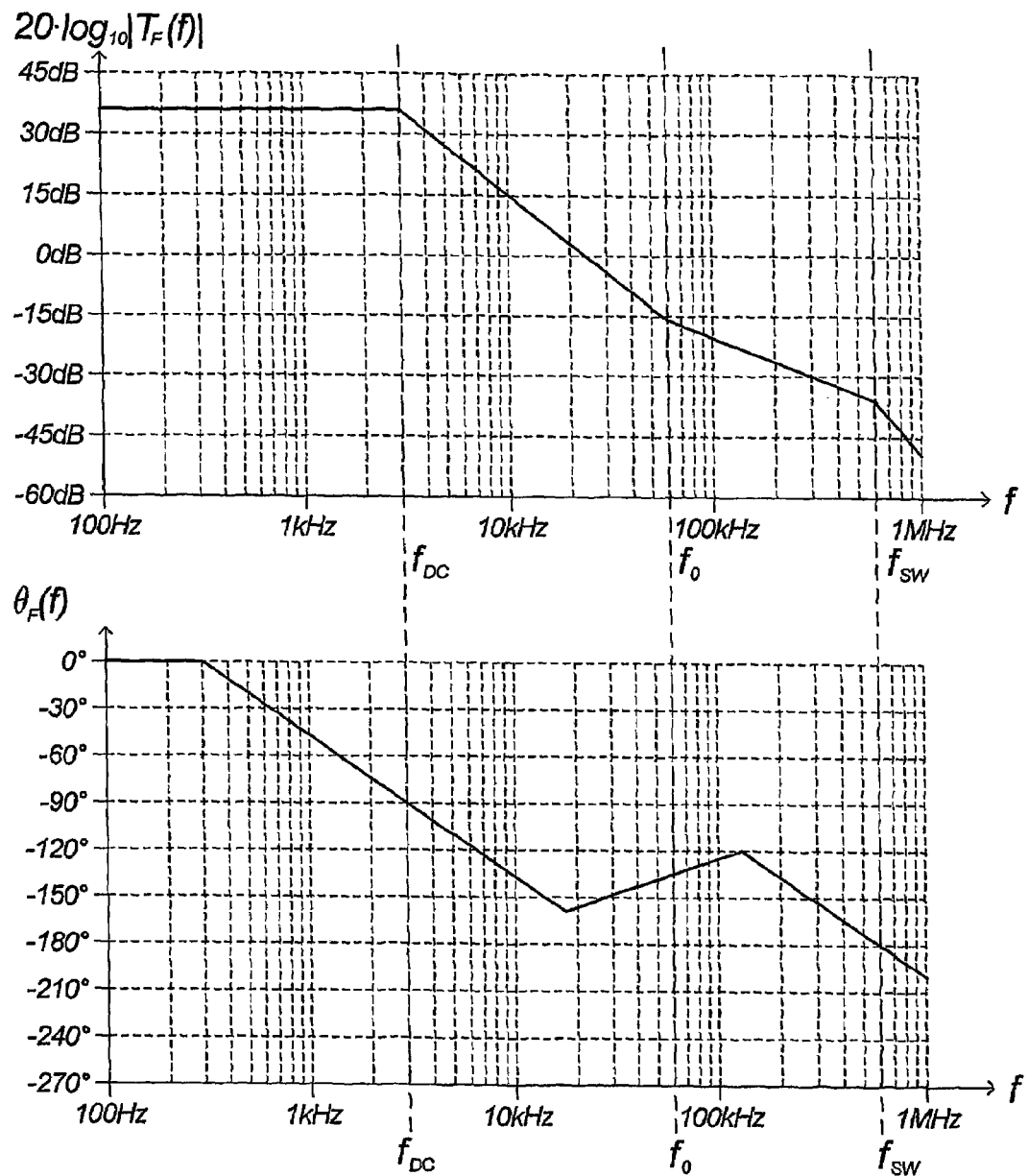
Figure 19:
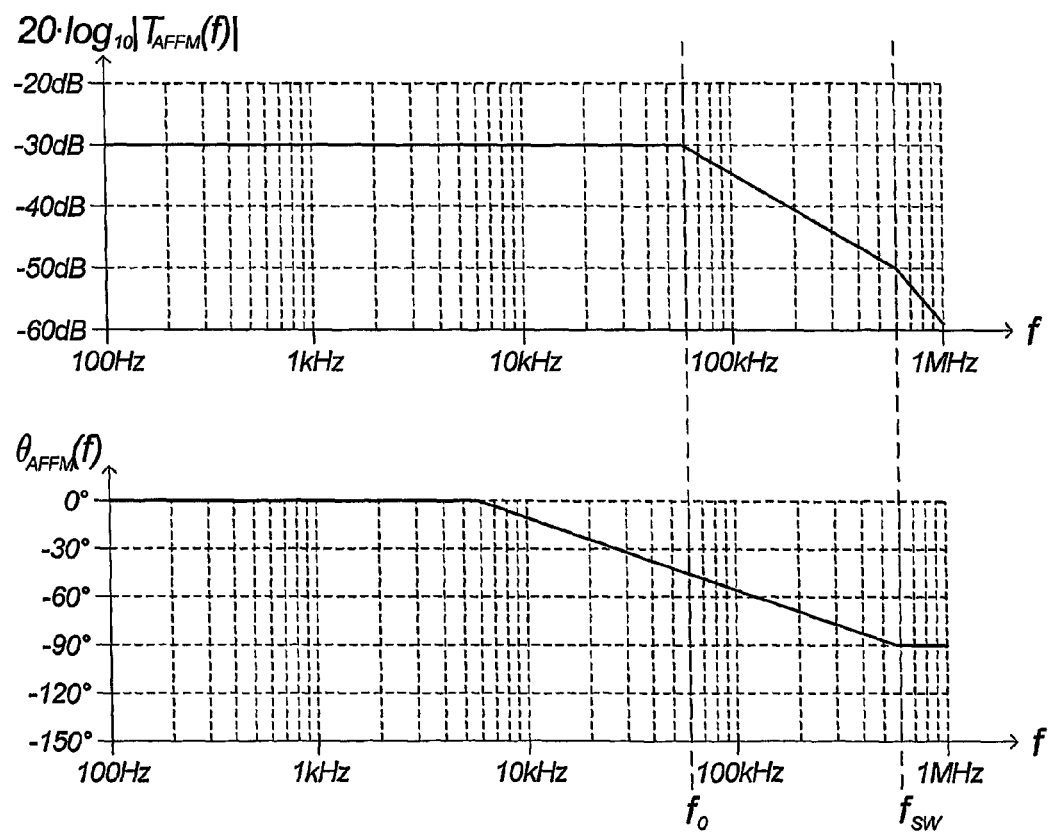
Figure 20:
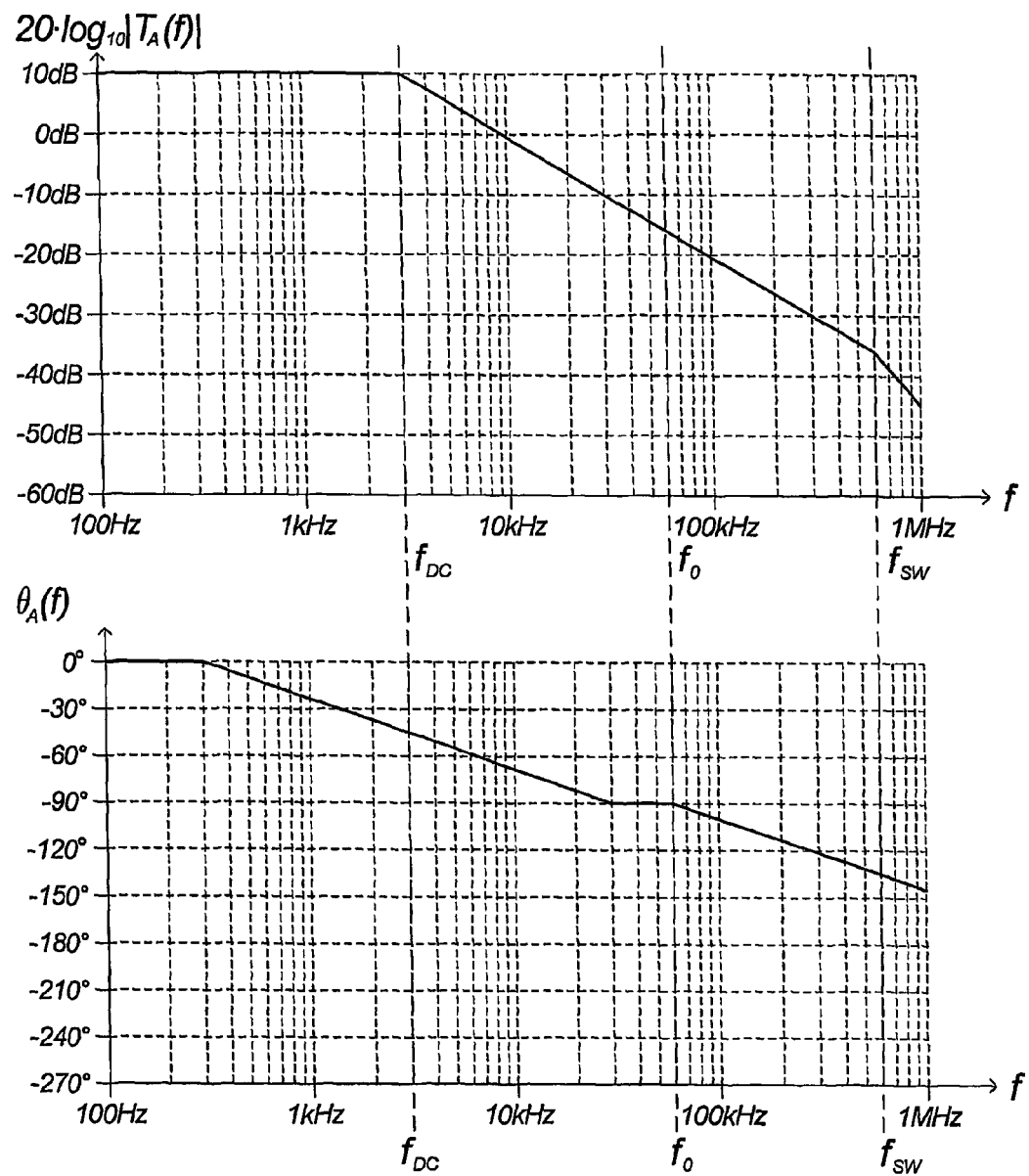
Figure 21:
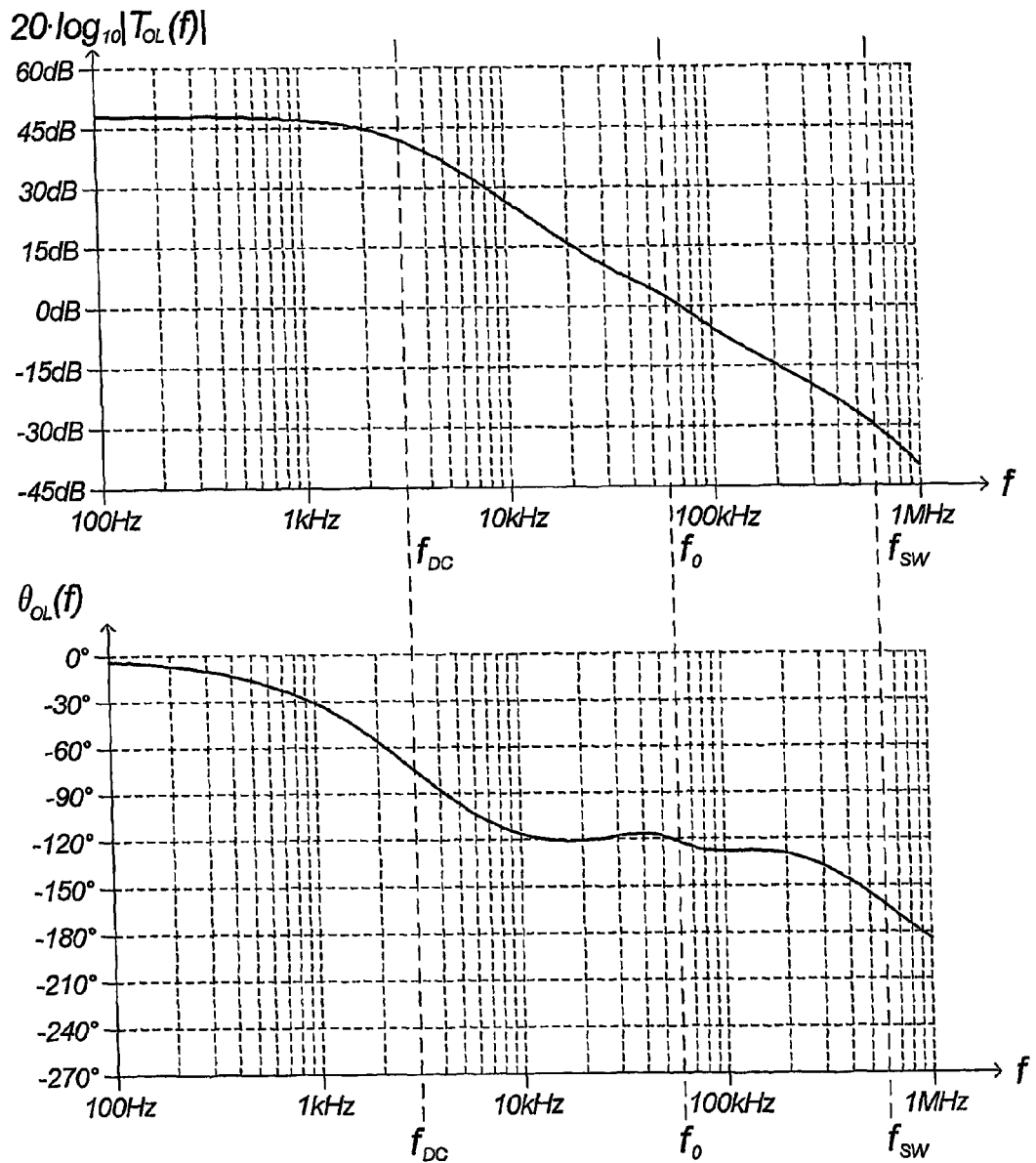
Figure 22A:
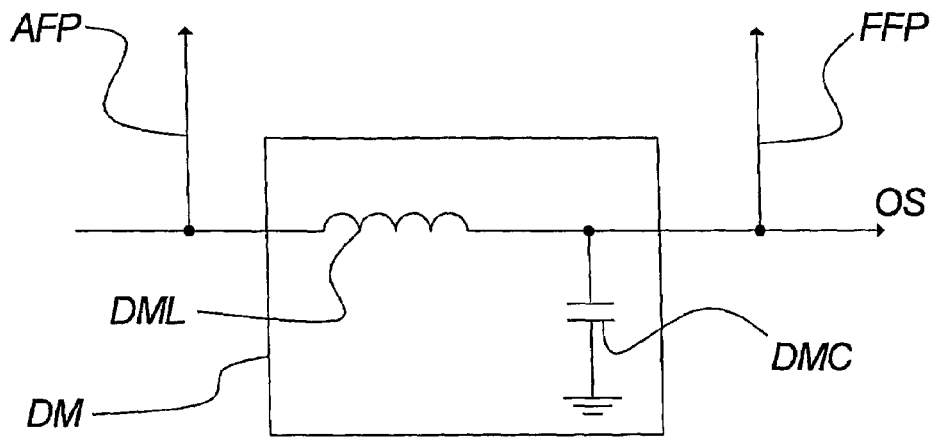
Figure 22B:
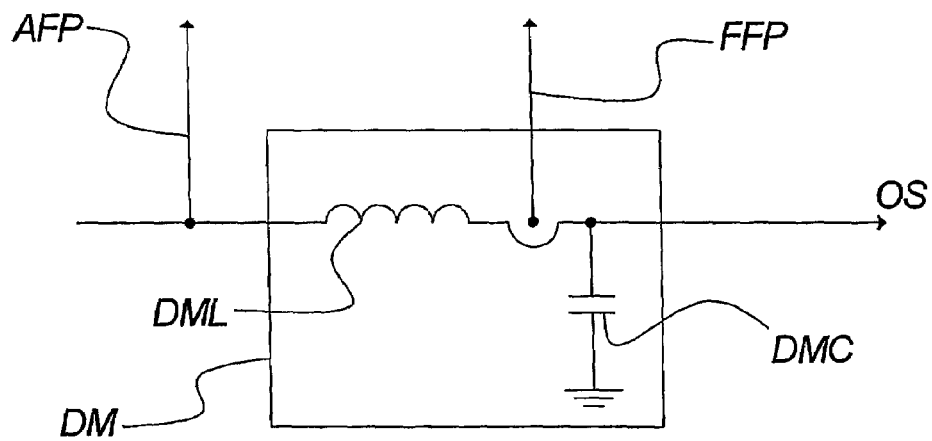
Figure 22C:
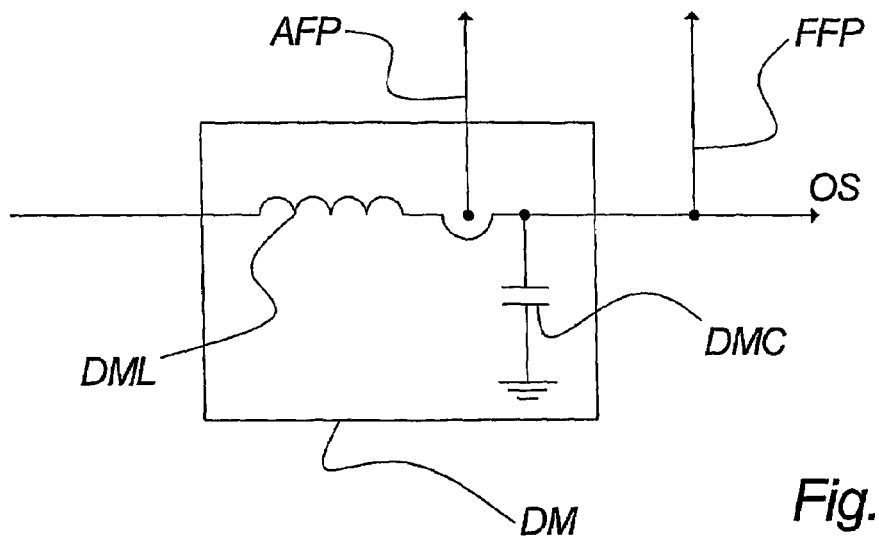

The invention will in the following be described with reference to the drawings where FIG. 1A-1C shows three conceptual embodiments of the present invention, FIG. 2A-2B illustrates a standard method of performing pulse width modulation, FIG. 3A-3B illustrates a more sophisticated method, FIG. 4A-4B describes how a feedback loop may be treated analytically, FIG. 5 shows a diagram of the ideal characteristic of a self-oscillating circuit, FIG. 6A-6B shows a first embodiment of the present invention, FIG. 7A-7B shows a second embodiment of the present invention, FIG. 8A-8B shows a third embodiment of the present invention, FIG. 9A-9B shows a fourth embodiment of the present invention, FIG. 10 shows a further embodiment of the present invention, FIG. 11 shows an open loop characteristic of an embodiment of the invention, FIG. 12 shows an embodiment of a demodulation means, FIG. 13 shows an embodiment of a demodulation means featuring auxiliary circuitry, FIG. 14 is a Bode-plot of the frequency response of an embodiment of a demodulation means, FIG. 15 is a Bode-plot of the frequency response of an embodiment of a first feedback filtering means, FIG. 16 is a Bode-plot of the frequency response of an embodiment of a first compensation filtering means, FIG. 17 is a Bode-plot of the frequency response of an embodiment of an additional compensation filtering means, FIG. 18 is a Bode-plot of the open-loop frequency response of an embodiment of a first feedback path, FIG. 19 is a Bode-plot of the frequency response of an embodiment of an additional feedback filtering means, FIG. 20 is a Bode-plot of the open-loop frequency response of an embodiment of an additional feedback path, FIG. 21 is a Bode-plot of the open-loop frequency response of an embodiment of the present invention, except the comparator means, FIG. 22A-22C shows three ways of picking off two feedback paths from the demodulation means.

DETAILED DESCRIPTION

FIG. 1A illustrates a conceptual embodiment of the present invention. It comprises a comparator means CM having input means IM and output means OM. To the output means OM is coupled a filtering means FM, which at least partly comprises a demodulation means DM. The output of the filtering means FM is the output signal OS of the circuit. This signal is also coupled to a summing point SP, where it is subtracted from an input signal IS, thus establishing negative feedback. The resulting signal is coupled to the input means IM of the comparator means CM.

The input means IM may be coupled to any kind of signal source, e.g. an analog signal, a digital signal, e.g. pulse code modulated, converted to an analog signal, a pulse width modulated analog signal, etc. If the input signal comprises a high frequency signal component, e.g. derived from a previous sample procedure or deliberately injected, it may cause the switch frequency of the self-oscillating circuit of the present invention to more or less follow this high frequency. By e.g. coupling a pulse width modulated signal to the input means IM, the present self-oscillating circuit will attempt to oscillate at the switch frequency of that PWM-signal.

As the comparator means CM, the demodulation means DM and other possible elements that may be placed in the forward path, such as e.g. a switch mode amplifier, are probably not ideal components, they distort the input signal with noise and other signal errors, and thereby decrease the signal/noise ratio of the circuit. One possible countermeasure would be to improve every component in the circuit, but this may be relatively more expensive than the gained outcome. Another possibility is to establish negative feedback, and thereby make the errors defeat themselves. This is why a signal is fed from the filtering means FM to the summing point SP, in the current embodiment of the present invention.

The comparator means CM preferably comprises modulation means for pulse width modulation (PWM). Such modulation means may e.g. comprise a comparator, an operational amplifier, etc.

The filtering means FM at least partly comprises demodulation means DM and thereto it may comprise any filtering means for any purpose, e.g. noise control, phase control, gain control, compensation, etc. Beside these or other purposes the filtering means FM must also ensure self-oscillation in the feedback loop. The comparator means CM depends on self-oscillation in the feedback loop to enable pulse width modulation in preferred embodiments. The self-oscillation is to a degree facilitated by the comparator means CM itself and probably by other possible elements in the loop but in order to ensure self-oscillation, obtain some control over it and preferably make it more independent to changes in the circuit, the input signals or the load, the filtering means FM must be designed with the purpose of self-oscillation in mind.

The demodulation means DM preferably comprises means for demodulating a pulse width modulated signal. Such demodulation means may e.g. comprise a low-pass filter as a PWM signal contains the original low-frequency signal as well as high frequency switching components. The demodulation means DM should preferably pass on signal components within a utility frequency band and reject signal components above that band, e.g. the high frequency switching components. A utility frequency band may e.g. be the frequency band comprising frequencies in the range of 0 Hz to 20 kHz, more preferably of 0 Hz to 60 kHz and even more preferably of 0 Hz to 100 kHz. The utility frequency band is considered to range over frequencies where the power loss is not more than 3 dB.

The demodulation means DM may comprise filtering means of any order. As the circuit preferably is used for amplification and the demodulation means is in the output stage of the circuit, the demodulation means preferably comprises low-loss power components such as coils and capacitors. Any other filtering means may though be used, especially for low-power circuits. A preferred demodulation means filter is a second order low-pass filter embodied by means of a coil and a capacitor.

The output signal OS is preferably taken directly at the output of the demodulation means DM. The feedback signal that is led back to the summing point SP is preferably the output signal OS but may in alternative embodiments as well be picked off anywhere else within the filtering means FM, e.g. before the filtering means FM, between two filtering components comprised by the filtering means FM, or within the demodulation means DM, e.g. by measuring the current through a coil of the demodulation means. One issue to consider when deciding where to pick off the feedback is that the feedback will only suppress noise introduced by components placed at the forward path within the feedback loop and not noise introduced by components before the summing point or after the pick off point.

An important issue when designing noise-suppressing feedback is the supported bandwidth of the feedback signal. This should be the bandwidth of the utility frequency band to ensure control with noise in the full utility band. Furthermore, the signal components within this band should be fed back with as much gain as possible to improve the noise suppression.

The summing point SP may be any means for subtracting or summing two signals. If only summation is available or is most convenient, subtraction may be implemented by negating one of the signals before summing them.

Though it is perfectly possible to implement the above-described embodiment of the present invention it tends to be unnecessarily complicated and expensive. It requires rather advanced and complicated filtering means to implement the filtering means FM due to its integrated position at only one place in the circuit. As different positions within a feedback network offer different filter simplification opportunities it will most often prove beneficial to divide a filter and place the parts at separate positions within the circuit. Also the position in the output stage of the circuit requires the filtering means FM to be able to handle power signals with a minimum of loss. Furthermore, this renders it complicated or even impossible to perform sophisticated filtering. Thus, the filtering means FM or parts thereof may advantageously be placed at different other positions in the circuit, e.g. in the feedback path.

However, as it is possible to convert any filter in one position into a filter suited for another position within a feedback network, the embodiment of FIG. 1A theoretically covers all embodiments with filters anywhere in the circuit. As long as the different filters are or may be treated as linear elements, such conversions may even be achieved by means of relatively simple, conventional network calculations. Accordingly, the embodiment of FIG. 1A may in most cases, though maybe not practically or profitably realizable, be used as a design middle stage where the desired network frequency responses have been decided and expressed as a single filtering means FM. Such resulting filtering means FM may subsequently be converted into separate filtering means positioned at different locations in the feedback network and thus eliminating some of the complexities by utilizing characteristics inherited from the different positions.

FIG. 1B shows an embodiment of the present invention where the filtering means FM has been split up into its demodulation means DM, a feedback filtering means FFM and a compensation filtering means CFM. The output means OM of the comparator means CM is coupled to the demodulation means DM and the output signal OS is taken from the demodulation means DM.

The feedback signal is again picked off the output signal but may in alternative embodiments be taken from anywhere within the demodulation means DM such as e.g. before any filtering is performed or in the middle of the filtering means, e.g. by measuring the current in a coil.

Part of the filtering means FM is converted to a feedback filtering means FFM placed in the feedback path and a compensation filtering means CFM placed in the forward path prior to the comparator means CM. The feedback filtering means FFM and compensation filtering means CFM may comprise any kind of filtering means for any purpose, preferably the same purposes as mentioned above for the filtering means FM.

By repositioning some of the filter characteristics from the output stage to the compensation filtering means CFM or the feedback filtering means FFM, the probable requirement of low-loss power components is removed. By also utilizing the characteristics inheritable from the different filter positions, the embodiment of FIG. 1B may be implemented as a much simpler and inexpensive circuit as the one in FIG. 1A.

FIG. 1C shows a further embodiment of the present invention where the filtering means FM of FIG. 1A has been divided into several filtering means and two feedback paths.

It comprises a comparator means CM having input means IM and output means OM. A demodulation means DM is coupled to the output means OM. The output of the demodulation means DM is the output signal OS of the circuit. From the output signal OS a first feedback path is further picked off featuring a first feedback filtering means FFFM. This first feedback signal is subtracted from an input signal by means of a first summing point FSP. The output of this is used as input to a first compensation filtering means FCFM. Furthermore, from the output means OM an additional feedback path is picked off featuring an additional feedback filtering means AFFM. This additional feedback signal is subtracted from the output of the first compensation filtering means CFM by means of an additional summing point ASP. The output from this is coupled to the input means IM of the comparator means CM. It is noted that one or more of the feedback paths may be picked off at other places, e.g. by letting one of the feedback paths measure the current through a coil within the demodulation means DM.

The comparator means CM and demodulation means DM may be as described above. The first and the additional feedback filtering means FFFM, AFFM, the first and the additional compensation filtering means FCFM, ACFM and the first and the additional summing points FSP, ASP may be as described above for the feedback filtering means FFM, the compensation filtering means CFM and the summing point SP, respectively.

By dividing part of the filtering means FM into more parallel coupled filtering means, e.g. FFFM and AFFM, the establishment of certain filter characteristics, e.g. complex conjugate poles or zero pairs, is much simpler than when implemented in an embodiment as e.g. FIG. 1A or 1B. Furthermore, parallel coupled filtering means cause the total filtering means less vulnerable to instability issues occurring in one of the paths.

It is noted that the technique of converting filtering means into several filter blocks that are coupled to each other by means of serial or parallel coupling may be applied in any degree, e.g. by two feedback paths as shown in FIG. 1C but also by more feedback paths, more filter blocks before or subsequent to the comparator means or in the feedback paths, etc.

FIG. 2A shows the principle behind standard pulse width modulation (PWM). It comprises a comparator CMP. An input signal INS is fed to the positive comparator input and a reference signal REF to the negative comparator input. With standard PWM this reference signal is most often a triangular or sawtooth waveform with a frequency significantly higher than the input signal, e.g. 10 or 20 times higher. The amplitude of the reference signal REF should be at least as high as the amplitude of the input signal INS. The comparator CMP establishes a modulated signal MS, which is a PWM-rendered version of the input signal INS. The modulated signal MS only has two values determined by the supply voltages. The output of the comparator CMP becomes high when the value of the input signal INS is higher than the value of the reference signal REF and the output becomes low when the value of the input signal is lower than that of the reference signal.

FIG. 2B shows a PWM amplifier circuit based on the PWM method described above. It comprises the comparator CMP which is connected to the input signal INS and to a reference source REF which produces a triangular waveform. The modulated signal MS is amplified by an amplifier AMP, e.g. a switch mode amplifier and then demodulated by means of a demodulator DEM which may e.g. be a low-pass filter. Optionally, a feedback loop comprising a filter FLT may be added to address problems with noise or errors resulting from the modulation and amplification, or to broaden the possible bandwidth.

One of several disadvantages of the method of realising pulse width modulation shown in FIG. 2B is the need of a very accurate and stable reference signal.

A variant of the above-described method of pulse width modulation of a signal is shown in FIG. 3A. Instead of feeding an input signal directly to the comparator CMP, which may e.g. be implemented as part of the comparator means CM described in the FIG. 1A-1C above, an input signal is merged with a reference signal to establish a composite input signal CINS. This signal is fed into the positive input of the comparator and a constant value signal DCS is fed to the negative input. The direct current signal DCS is preferably just grounded to provide a 0V DC input but may have any constant voltage applied according to specific embodiments and needs. The output of the comparator is high when the composite input signal CINS is higher valued than the constant signal DCS and low when the composite input signal is lower valued than the constant signal. The resulting pulse width modulation of the input signal is the same as with the first method described.

The composite input signal CINS may be established in a number of ways some of these yet involve the supply of a very accurate and stable reference signal. A more sophisticated method of modulating the input signal with a high frequency signal to establish the composite input signal necessary for the most recent described PWM method is based on unstable feedback loops.

An unstable loop in the present context is a circuit that for one or more frequencies or frequency bands has an unbounded response, e.g. a very huge gain approaching infinity. It is well known that an oscillator may be established by providing a loop that is unstable at a certain frequency and then stimulate that loop. Due to resonance, a signal having that frequency will build up. By establishing such an unstable loop around a comparator and modifying the loop to be unstable at a frequency significantly higher, e.g. 10 or 20 times higher than the desired bandwidth of the input signal, a high frequency reference signal is established and merged with the input signal when the loop is stimulated by the input signal. This may be referred to as a self-oscillating loop or self-oscillating pulse width modulation.

FIG. 3B shows an example of such a self-oscillating PWM amplifier circuit. It is equal to the circuit shown in FIG. 2B except for the reference source REF being removed and the feedback loop with the filter FLT being shown in solid lines as a loop is mandatory for a self-oscillating amplifier though its pick off and summing points may be chosen differently. Instead of being connected to a reference source, the negative input to the comparator is connected to a DC source, which in the present example is ground, i.e. 0V DC. Which input, positive or negative, is coupled to the signal and to ground may also be changed, though this may require further sign handling elsewhere in the circuit. In an advanced embodiment of the present invention, coupling a control signal to the negative input instead of a DC signal may enable compensation of certain errors.

The filter FLT has to be designed in such a way that the closed feedback loop is unstable at a certain high frequency, the switch frequency $f_{SW}$, and that frequency should preferably be at least approximately 5-10 times higher than the bandwidth of the utility frequency band of the circuit. Thereby, a high frequency waveform will arise in the loop, be merged with the input signal INS at the summing point forming a composite input signal CINS which is then compared with the DC signal DCS by the comparator.

Several embodiments of the filter and variants of the loop layout are possible, one of these would be to take out the feedback signal after the demodulator DEM and thereby make the demodulator a part of the feedback loop.

Apart from the shown embodiment of a self-oscillating PWM amplifier several embodiments of self-oscillating PWM circuits exist. These are not further explained here as they are not as closely related to the present invention as the one shown in FIG. 3B.

When describing a feedback network such as e.g. the ones in FIG. 1A to 1C, two different views may be presumed, respectively closed loop view and open loop view. A closed loop view characterizes the network as the ratio between the output signal OS and the input signal IS and thus describes how the network will affect an input signal. An open loop view on the other hand considers the network on its own by ignoring any inputs and outputs and instead cuts the loop open at one node and characterizes the network as the ratio between the signal before and after the cut.

FIGS. 4A and 4B are provided for the purpose of describing loop instability in more detail and may also illustrate the difference between closed loop view and open loop view. FIG. 4A shows an example of a simple feedback network comprising a forward path A with a possibly frequency dependent transfer function $T_A(s)$ and a negative feedback path B with a possibly frequency dependent transfer function $T_B(s)$. The input of the network is denoted $V_{IN}(s)$ and the output is denoted $V_{OUT}(s)$.

FIG. 4B shows an open loop view of the same network. The network of FIG. 4A is cut open between the points marked with C2 and C1. It comprises the probably frequency dependent transfer function $T_A(s)$ and the probably frequency dependent transfer function $T_B(s)$. When discussing the open loop characteristic here and in the following the summing point is, due to clarity, omitted and thereby its negating effect. Thus, when an open loop transfer function is used to e.g. obtain a closed loop transfer function a negation is performed on the open loop transfer function.

Hence, the open loop transfer function $T_{OL}(s)$ of the network, i.e. the ratio between C2 and C1 in FIG. 4B, may be expressed as:

$$T_{OL}(s) = \frac{V_{C2}(s)}{V_{C1}(s)} = T_A(s)T_B(s)$$

The overall closed loop transfer function $T_{CL}(s)$ of the network, i.e. the ratio between $V_{OUT}(s)$ and $V_{IN}(s)$ in FIG. 4A, may be expressed as:

$$T_{CL}(s) = \frac{V_{OUT}(s)}{V_{IN}(s)} = \frac{T_A(s)}{1-(-T_{OL}(s))} = \frac{T_A(s)}{1+T_A(s)T_B(s)}$$

The criterion for a circuit to be unstable is that it has unbounded response for one or more frequency bands. With the feedback network of FIG. 4A this means that the closed loop transfer function $T_{CL}(s)$ should have a gain approaching infinity for at least one frequency band. This may be expressed in this way:

$$T_{CL}(s) = \frac{T_A(s)}{1+T_A(s)T_B(s)} = \infty$$
$$\Rightarrow 1 + T_A(s)T_B(s) = 0$$
$$\Rightarrow T_A(s)T_B(s) = -1 = |1|\angle 180°$$
$$\Rightarrow T_{OL}(s) = |1|\angle 180°$$

From this it is seen that an unstable loop may be realized by letting the total phase shift of the open loop transfer function $T_{OL}(s)$, i.e. the total combined filter around the loop, be 180° and the gain of the open loop be 1 which corresponds to 0 dB. As it is possible and actually most likely that a filter has different phase shift characteristics for different frequencies it is possible to design an open loop transfer function that is unstable around a certain high frequency only.

Applying this to the embodiments of FIG. 1A to 1C it is seen that the total phase shift introduced by the filtering means FM, the comparator means CM and any other elements around the loop should be −180°.

Beside the requirement for the loop to be self-oscillating it is in most applications a major purpose of the feedback loop to cause rejection of noise, distortion and errors introduced in the forward path of the loop. Hence, it is often desired to pick off the feedback subsequent to any forward path elements in order to eliminate their noise components. Also the gain in the feedback path is important as the higher feedback gain, the better suppression of noise, distortion and errors. As a utility frequency band is defined and preferably supported by the demodulation means DM the feedback filtering means FFM and other filtering means throughout the circuit should also support this utility frequency band. Thus, the feedback signal should be subject to high gain for signal components within the utility frequency band and attenuation for signal components with frequencies above that band.

From the above-mentioned two major concerns of self-oscillation and high open loop gain an ideal frequency response may look like the diagram in FIG. 5. It comprises a logarithmic gain characteristic and a phase shift characteristic of the transfer function of the open loop, $T_{OL}(s)$ of a self-oscillating circuit. The gain characteristic is shown with asymptotic curves. The frequency axes are logarithmic.

Vertical, dashed lines indicate three specific frequencies, a low frequency $f_{DC}$, the upper frequency $f_0$ of the utility frequency band and the higher switch frequency $f_{SW}$ that drives the PWM modulation. The gain characteristic is shown to have a flat gain DCG from 0 Hz to the low frequency $f_{DC}$ where it then rolls off. Due to the self-oscillation it intersects with 0 dB at the switch frequency $f_{SW}$. As the DC gain DCG is desired to be as high as possible to obtain the best noise suppression, and it is always 0 dB at the switching frequency $f_{SW}$ the slope of the rolling off gain characteristic determines the interval between the two frequencies. Thus, the higher the switch frequency is in relation to the low frequency $f_{DC}$ and the steeper the gain slope, the higher DC gain DCG is obtainable.

As a desired DC gain DCG is often specified beforehand due to a need or desire of a specific signal/noise ratio, the last parameters, the slope and nature of the roll off and the position of the low frequency $f_{DC}$ and the switch frequency $f_{SW}$ have to achieve this. As they are tightly bound to each other their determination is often a balancing. A relatively low switch frequency $f_{SW}$ may reduce the demands on the comparator means CM, a possible switch mode amplifier AM, and the other components in the loop but on the other hand it will require higher ordered filtering means to create a steeper gain roll off. On the other hand, a gently decreasing gain requires a high switch frequency $f_{SW}$ but there is often an upper limit to that frequency as especially the switch mode amplifier but also other components introduce an intolerable high amount of noise to signals above a certain frequency.

The phase shift characteristic shown in FIG. 5 illustrates the boundaries that the phase shift of an open loop characteristic of a self-oscillating circuit should observe. At frequencies below the switch frequency $f_{SW}$ including the utility frequency band the phase shift should be above −180°, at the switch frequency the phase shift characteristic intersects with −180° and at higher frequencies assumes a value below −180°. The angle that lacks in order for the phase shift to be −180° within the utility frequency band is denoted utility band phase margin UPM. This should be as small as possible at as low a frequency as possible in order to obtain the steepest possible gain slope and the earliest possible gain roll off, respectively. Practically, there is however a minimum utility band phase margin UPM in order to ensure stability for all frequencies below the switch frequency $f_{SW}$. This minimum phase margin varies for different embodiments and depends e.g. on the robustness of the circuit, the kind of input signal, the component quality, etc. In a preferred embodiment of the invention, the minimum phase margin is 20°. In order to obtain a circuit with a relatively small phase margin a relatively high order filtering means with properly positioned filter poles and filter zeroes are required.

The phase characteristic may be controlled by means of delays, filtering means, etc. The comparator means CM and possible switch mode amplification means introduce a delay. To control the phase, i.e. ensuring self-oscillation at the right frequency, filtering means have to be adapted for that purpose. The higher order of the filtering means, the better the phase may be controlled.

FIGS. 6A and 6B illustrate an embodiment of the present invention. FIG. 6A is a logarithmic gain plot of the embodiment where the positions of filter poles and filter zeroes are indicated by means of crosses and circles, respectively. FIG. 6B is a phase margin plot according to the gain plot of FIG. 6A. The filter poles and filter zeroes are also indicated on this plot though positioned at the same frequencies as in FIG. 6A.

As seen, the gain curve intersects with 0 dB at 400 kHz and the phase margin is for that frequency accordingly 0°. Thus, this frequency is the switch frequency of this exemplary embodiment. The present embodiment comprises nine filter poles and six filter zeroes and is thus a ninth order system. The six filter zeroes are paired to the second to seventh filter poles and spaced a little to the left of each corresponding pole. Because of the high order, a relatively flat phase margin curve and a relatively linear negative gain slope is achieved for most of the utility frequency band which in this embodiment is the audio band. The phase margin in the utility band decreases to 60° corresponding to a phase shift of −120° and the slope of the gain curve is about −25 dB per decade. The linear gain slope and flat phase margin in the utility band resembles the curves of a first order or second order filter except that the gain slope of a first order filter would be −20 dB per decade and the phase margin 90° and of a second order filter would be 40 dB per decade and 0°. Thus, the present embodiment performs better than a simple first order system because of steeper slope and smaller phase margin without becoming a second order system which would be unstable at low frequencies. The utility band of the present embodiment may be described as having an effective order of −25 dB/−20 dB=1,25.

With the embodiment of FIGS. 6A and 6B, an open loop gain of about 130 dB at DC and 70 dB at 1 kHz is obtained.

FIGS. 7A and 7B illustrate a further embodiment of the present invention. FIG. 7A is a logarithmic gain plot of the embodiment where the positions of filter poles and filter zeroes are indicated by means of crosses and circles, respectively. FIG. 7B is a phase margin plot according to the gain plot of FIG. 7A. The filter poles and filter zeroes are also indicated on this plot though positioned at the same frequencies as in FIG. 7A.

As with the embodiment of FIGS. 6A and 6B the switch frequency of this exemplary embodiment is 400 kHz. The present embodiment again comprises nine filter poles and six filter zeroes and is thus again a ninth order system. The six filter zeroes are again paired to the second to seventh filter poles but are in this embodiment spaced a little longer to the left of each corresponding pole than with the embodiment of FIGS. 6A and 6B. Again, because of the high order, a relatively flat phase margin curve and a relatively linear negative gain slope are achieved for most of the utility frequency band which in this embodiment is the audio band. The phase margin in the utility band decreases to 45° corresponding to a phase shift of −135° and the slope of the gain curve is about −30 dB per decade. The utility band of the present embodiment may be described as having an effective order of −30 dB/−20 dB=1,5.

With the embodiment of FIGS. 7A and 7B, an open loop gain of about 140 dB at DC and 80 dB at 1 kHz is obtained.

FIGS. 8A and 8B illustrate a preferred embodiment of the present invention. FIG. 8A is a logarithmic gain plot of the embodiment where the positions of filter poles and filter zeroes are indicated by means of crosses and circles, respectively. FIG. 8B is a phase margin plot according to the gain plot of FIG. 8A. The filter poles and filter zeroes are also indicated on this plot though positioned at the same frequencies as in FIG. 8A.

As with the embodiment of FIGS. 6A and 6B and of FIGS. 7A and 7B, the switch frequency of this exemplary embodiment is 400 kHz. The present embodiment again comprises nine filter poles and six filter zeroes and is thus again a ninth order system. The six filter zeroes are again paired to the second to seventh filter poles but are in this embodiment spaced even more to the left of each corresponding pole than with the embodiment of FIGS. 7A and 7B. Again because of the high order a relatively flat phase margin curve and a relatively linear negative gain slope is achieved for most of the utility frequency band which in this embodiment is the audio band. The phase margin in the utility band decreases to 30° corresponding to a phase shift of −150° and the slope of the gain curve is about −35 dB per decade. The utility band of the present embodiment may be described as having an effective order of −35 dB/−20 dB=1,75.

With the embodiment of FIGS. 8A and 8B, an open loop gain of more than 150 dB at DC and almost 90 dB at 1 kHz is obtained.

FIGS. 9A and 9B illustrate an even further embodiment of the present invention. FIG. 9A is a logarithmic gain plot of the embodiment where the positions of filter poles and filter zeroes are indicated by means of crosses and circles, respectively. FIG. 9B is a phase margin plot according to the gain plot of FIG. 9A. The filter poles and filter zeroes are also indicated on this plot though positioned at the same frequencies as in FIG. 8A.

As with the embodiment of FIGS. 6A and 6B and of FIGS. 7A and 7B, the switch frequency of this exemplary embodiment is 400 kHz. However, the present embodiment only comprises five filter poles and two filter zeroes and is thus a fifth order system. The two filter zeroes are paired to the second and third filter poles, and are in this embodiment spaced relative far to the left of each corresponding pole. Because of the lower order, relative to the three above-described embodiments the phase margin curve does not become flat though it fluctuates around an average value and the gain slope is not quite linear. The phase margin in the utility band decreases to an average value of about 35° corresponding to a phase shift of −145°.

With the embodiment of FIGS. 9A and 9B, an open loop gain of about 135 dB at DC and about 80 dB at 1 kHz is obtained.

FIG. 10 shows a block diagram of a further preferred embodiment of the present invention. Conceptually, the embodiment of FIG. 10 is the same as the one introduced in FIG. 1C but more detailed. According to the invention, any number of parallel feedback loops with same or different pick off points may be established. In the following, references to an inner loop, inner feedback loop, inner feedback filter and/or inner compensator may refer to one or more loops or elements comprised by such loops qualified by being picked off prior to the demodulation means DM, and subtracted from the forward path subsequent to any first compensation filtering means FCFM. Likewise, references to an outer loop, outer feedback loop, outer feedback filter and/or outer compensator may refer to one or more loops or elements comprised by such loops qualified by being picked off subsequent to the demodulation means DM and subtracted from the forward path prior to any additional compensation filtering means ACFM and preferably prior to at least one outer compensation filtering means.

Though the PWM modulator CM preferably is of the type shown in FIG. 3A, i.e. made from a comparator, other methods and embodiments of the PWM modulator, e.g. a comparator with hysteresis for controlling the delay, are within the scope of the invention. In the present preferred embodiment the comparator means CM further comprises amplification means AM. Such amplification means may be conventional amplification means or it may utilize the fact that the signal to be amplified is a PWM signal and thus preferably only comprises two signal levels. Such amplification means AM may e.g. be a switch mode amplifier. As this is the preferred choice the amplification means AM may in the following be referred to as a switch mode amplifier.

The switch mode amplifier AM preferably comprises two switches and control means for determining which switch to close. The switches are preferably MOSFET transistors because of their speed and wide availability with regard to voltage ranges but may as well be any other types of transistors, e.g. bipolar transistors or electronic switches, electromechanical switches as e.g. relays or any other kind of electronically controllable switches. One of the switches is preferably placed between a positive supply voltage and the output and the other between a negative supply voltage and the same output. The supply voltage may e.g. be ±50V DC e.g. for use in a power amplifier but may be any other voltage range, e.g. ±15V DC or 0V and 5V DC, e.g. for small signal or data amplifiers. The control circuitry is able to open and close these switches according to the input signal which is the pulse width modulated signal from the PWM modulator. Preferably, the amplifier outputs a constant voltage, e.g. the positive supply voltage when the input is high and another constant voltage, e.g. the negative supply voltage when the input is low.

The particular embodiment of a switch mode amplifier AM described above has a couple of disadvantages. If both switches for some reason should be closed on the same time they would establish a short circuit between the positive and negative supply voltages which could damage the circuit. To avoid this, the control circuitry may exercise a short delay between the closing of one switch and the opening of the other. This delay, together with the time it takes for a switch to close and another to open, affects the signal being amplified by adding noise. Thus, the faster switches, the better. As the switching delay corresponds to the type and size of switches, it may roughly be concluded that the smaller the amplifier, the faster the switches. A power amplifier of this type is thus probably more liable to add noise to the signal than a small-signal amplifier.

It is noted that the above-described embodiment of a switch mode amplifier AM is just one possible embodiment and that any other amplifier suitable for amplifying PWM signals may be applied, e.g. switch mode amplifiers having more switches, switch mode amplifiers with differential output, other kind of switches, other working principles, etc.

The feedback filters and compensators may be of any possible kind. Thus, passive or active filters, first order, second order or higher order filters, analogue or digital filters, amplifiers, attenuators, delay-blocks, etc. may be used within the scope of the invention. Even just a simple wire, a straight or twisted printed circuit board track or even no wire may form the required feedback filter and/or compensator within a specific embodiment of the invention.

The demodulation means DM is preferably a low-pass filter but may be any kind of analog or digital filter or circuit adapted to demodulate a pulse width modulated signal. Furthermore, the demodulator may comprise additional circuitry or elements, e.g. to adapt the output to a specific load or subsequent circuit or to make the circuit more robust, e.g. to changing loads, etc. One such additional element may e.g. be a Zöbel network, which ensures that the oscillation amplifier does not become unstable when no load is applied to the output.

The summing points FSP, ASP may be implemented in any way suitable within the scope of the present invention. They may be made of discrete, passive components only, dedicated chips, logic circuits, active elements, etc. In a preferred embodiment of the invention, the subtraction shown as part of the summing point is achieved by inverting the feedback signal and then adding it to the forward path signal.

The references C2 and C1 are merely reference points used in the description.

FIG. 11 shows an open loop view of the embodiment in FIG. 10. The input signal IS and output signal OS are ignored and the loop is cut open between the references C2 and C1 thus forming the network shown in FIG. 11. To simplify the calculations, the additional compensation filtering means ACFM is shown twice, once in each feedback path which is equivalent to placing it behind the summing point in FIG. 11.

If the network components are chosen to be linear time-invariant continues-time filters or components that may be treated that way within the frequency band of interest, they may be easily substituted, relocated and calculated on by relatively simple rules.

The comparator means CM with the comprised amplification means AM is by nature non-linear components and is thus harder to consider in a mathematical scope. But for all other components, it is most often possible to apply the above-mentioned assumption.

In the following detailed description of the blocks in FIGS. 10 and 11, the oscillation amplifier of the present invention is due to simplification exemplified as an audio power amplifier though it actually may be used for any amplification or filtering purpose further including e.g. pre-amplification of audio signals, data signal amplification, small signal amplification, etc. Yet defined as an amplifier for audio signals, a few exemplary base values are also defined. The desired bandwidth, i.e. the width of the frequency band where the gain is within 3 dB of the desired gain, is set to the frequency band ranging from DC=0 Hz to $f_0$=60 kHz and the oscillating frequency of the self-oscillating loops and thereby the switching frequency of the switching amplifier is set to about $f_{SW}$=600 kHz. Due to the nature of some embodiments of the present invention including the one described in the following the switching frequency $f_{SW}$ may not be entirely fixed. Thus, the frequency at which the full system will oscillate may not be exactly the chosen $f_{SW}$ frequency. It is noted that the values and purposes mentioned here for use with the following example are, though preferred, only exemplary values, and embodiments with any other values or purposes are within the scope of the present invention.

With the present exemplary values the circuit should be designed to become unstable at the switching frequency $f_{SW}$ but remain stable in a wide frequency band from DC to well beyond the bandwidth of 60 kHz.

The open loop transfer function $T_{OL}(s)$ as derived from FIG. 11 may be expressed as this:

$$T_{OL}(s)=T_{CM}(s)\cdot(T_{AFFM}(s)T_{ACFM}(s)+T_{DM}(s)T_{FFFM}(s)T_{FCFM}(s)T_{ACFM}(s))$$

As described above, the above expression should meet the requirement of −180° phase shift at the desired switching frequency $f_{SW}$ to ensure self-oscillation and preferably also additional requirements regarding utility band gain to ensure proper noise rejection.

The significant elements of the transfer function of the comparator means CM with amplification means AM are in this embodiment a constant gain $K_{CM}$ and a delay $t_{CM}$ derived from the propagation delay of the comparator and switch circuitry and the forced dead-time in the switch circuitry to avoid short circuiting the power supply and it may thus be expressed as:

$$T_{CM}(s)=K_{CM}e^{(-t_{CM}s)}$$

The delay may e.g. be 20 ns for the comparator and 180 ns for the switching amplifier thus e.g. $t_p$=200 ns. The constant gain may e.g. be 30 dB. As the delay is almost fixed the power stage phase shift depends largely on the frequency in this way:

$$\theta_{CM}(f)=-f\cdot t_{CM}\cdot 360°$$

And with the present example values the phase shift at $f_0$ and $f_{SW}$, respectively:

$$\theta_{CM}(f_0)=-60\cdot 10^3\cdot 200\cdot 10^{-9}\cdot 360°=-4,32°$$

$$\theta_{CM}(f_s)=-600\cdot 10^3\cdot 200\cdot 10^{-9}\cdot 360°=-43,2°$$

An embodiment of a preferred demodulation means DM is shown in FIG. 12. It is designed as a second order passive low pass filter and comprises an inductor DML and a capacitor DMC. The low pass filter component values may be chosen according to the expected load, e.g. to cause a Q-value of $3^{-1/2}$ with a load of 4 Ω. The Q-value expresses the likelihood of a circuit to become unstable.

FIG. 13 shows an example of auxiliary circuitry, i.e. a Zobel network ZN. The Zöbel network comprises a capacitor ZNC and a resistor ZNR and is applied to avoid that the filter Q approaches infinite in case the load is removed. If that happens, the amplifier may become unstable in an uncontrolled way and probably cause severe damage to the oscillation amplifier circuit.

In the following, the demodulator is considered as shown in FIG. 12, i.e. without the Zöbel network. The transfer function $T_{DM}(s)$ of the demodulation means is then:

$$T_{DM}(s) = \frac{(2\pi f_0)^2}{s^2 + 4\pi f_0 \zeta s + (2\pi f_0)^2}$$

where in this example embodiment:

$$f_0 = \frac{1}{2\pi\sqrt{L_{DML}\cdot C_{DMC}}} \text{ and}$$

$$\zeta = \frac{\sqrt{L_{DML}}}{2R_{LOAD}\sqrt{C_{DMC}}} = \frac{1}{4\pi R_{LOAD}C_{DMC}f_0}$$

The second order demodulator filter is designed with a break frequency of $f_0$ to pass through any signal components within the utility frequency band and reject signal components with higher frequencies which in this PWM application primarily are components at the switch frequency. Thus, it has two poles placed at $f_0$. A Bode plot showing the frequency response of the demodulation means of this embodiment as a logarithmic gain $20\log_{10}|T_{DM}(f)|$ in dB versus frequency and a phase shift $\theta_{DM}(f)$ in degrees versus frequency is shown in FIG. 14. The real curves are substituted by asymptotic curves due to simplicity. The characteristic logarithmic gain slope of −40 dB per decade for second order filters appears clearly from the plot together with the also characteristic −180° phase shift. Regarding the wish to reach instability at $f_{SW}$ this demodulator alone achieves the required phase shift of −180° but as other components in the open loop apply their phase shifts as well, the loop is thus bound to become unstable far below the desired frequency if no compensation is applied.

The first feedback filtering means FFFM is in this embodiment designed to make up for some of the not needed and not wanted phase shift introduced mainly by the demodulation means. It comprises a zero at $f_0$ which cancels one of the poles of the second order demodulator. Its transfer function $T_{FFFM}$(s) may look like this:

$$T_{FFFM}(s) = \frac{1}{2\pi f_0}s + 1$$

FIG. 15 shows a Bode-plot of the frequency response of this embodiment of a first feedback filtering means.

The first compensation filtering means FCFM is in this embodiment a phase lag compensator which has a gain of e.g. −5 dB at DC and has a low frequency pole and thereby a break frequency at $f_{DC}$ which may e.g. be 3 kHz as in this example but otherwise anything from DC to 10 kHz or higher. Furthermore, the compensation filtering means has a cancelling zero which causes the negative gain slope to break and the phase to increase at $f_0$ and an additional pole at the switching frequency, $f_{SW}$, to weaken the gain at high frequencies and to cause the needed phase shift:

$$T_{FCFM}(s) = \frac{f_0}{K_{FCFM} f_{DC}} \cdot \frac{\frac{1}{2\pi f_0}s + 1}{\left(\frac{1}{2\pi f_{DC}}s + 1\right)\left(\frac{1}{2\pi f_{SW}}s + 1\right)}$$

A Bode-plot illustrating in terms of asymptotic curves the frequency response of the first compensation filtering means FCFM is shown in FIG. 16. As seen from the phase shift plot, the phase shift at the switching frequency is approximately −45°.

The additional compensation filtering means ACFM is in this embodiment of the invention also a phase lag compensator with the same characteristic as the first compensation filtering means FCFM except for the gain. The additional compensator has a gain of e.g. 40 dB at DC and has a low frequency pole and thereby a break frequency at $f_{DC}$ which may e.g. be 3 kHz as in this example but otherwise anything from DC to 10 kHz or higher. Furthermore, the compensator has a cancelling zero which causes the negative gain slope to break and the phase to increase at $f_0$ and an additional pole at the switching frequency, $f_{SW}$, to weaken the gain at high frequencies and to cause the needed phase shift:

$$T_{ACFM}(s) = \frac{1}{2} \cdot \frac{f_{SW}}{f_{DC}} \cdot \frac{\frac{1}{2\pi f_0}s + 1}{\left(\frac{1}{2\pi f_{DC}}s + 1\right)\left(\frac{1}{2\pi f_{SW}}s + 1\right)}$$

The expression for $T_{ACFM}(s)$ is halved because both the first and the additional feedback paths are sought to contribute to the oscillation with the same voltage, i.e. in the ratio 1 to 1. Hence, both their gains should preferably be reduced by a factor of 2. In other embodiments of the invention, the ratio at which the feedback loops contribute may be set to anything, e.g. 2 to 1 or 1 to 4. This gain reduction may in other embodiments be carried out elsewhere, e.g. in the comparator means CM, or in a block dedicated thereto. The gain ratio between the two or possibly more loops determines which loops have the greatest control over the switching frequency. This should be balanced with the need for feedback for noise suppression reasons as the feedback loops are not good for this purpose if their gains are too reduced.

FIG. 17 shows a Bode-plot corresponding to the frequency response of the additional compensation filtering means design of the present embodiment. It can be seen that the phase shift introduced by the additional compensation means approximates −45°.

From the first and additional compensation filtering means plots are seen that the current embodiment of compensator causes the phase shift to alternate. If the break frequencies are moved back or forth the phase shift characteristic will follow, thus enabling a designer to use compensators of this type to place a desired phase shift at a specific frequency. It is noted that numerous types of filters or other networks may be used for the compensators and that several of these may offer the same or better control over the phase characteristic. Such other possible compensator types may e.g. be a phase-lead compensator, a phase-lag-lead compensator, a delay block, etc, or any combination of filters.

In accordance with the purpose of the compensators it may be necessary to change the positions of their poles and zeroes slightly to fine-tune the loop response. Hence, it is noted that the positions of poles and zeroes, break frequencies, amounts of phase shifts and other values mentioned more or less exact above regarding the compensators or other components may be changed to any suitable values in order to fine-tune the circuit or to change its characteristics, e.g. its utility bandwidth or switching frequency. Furthermore, additional blocks, e.g. additional filters or compensators may be added to the loop anywhere. Such changes are within the scope of the present invention.

FIG. 18 shows a Bode-plot of the resulting first feedback path transfer function $T_F(s)$ comprising the demodulation means DM, the first feedback filtering means FFFM, the first compensation filtering means FCFM and the additional compensation filtering means ACFM. It can be seen from the plot that the phase shift is −180° at the switch frequency $f_{SW}$.

The additional feedback filtering means AFFM is in this embodiment of the invention designed as a first order low pass filter having a pole and thereby a break frequency at $f_0$ and a constant damping of $K_{AFFM}^{-1}$:

$$T_{AFFM}(s) = \frac{1}{K_{AFFM}} \cdot \frac{1}{\frac{1}{2\pi f_0}s + 1}$$

The frequency response of the additional feedback filtering means AFFM is shown as a Bode plot in FIG. 19 as a logarithmic gain $20\log_{10}|T_{AFFM}(f)|$ in dB versus frequency and a phase shift $\theta_{AFFM}(f)$ in degrees versus frequency. The real curves are substituted by asymptotic curves due to simplicity.

From the Bode plot in FIG. 19 the logarithmic gain slope of −20 dB per decade and the phase shift of −90° are seen which both characterize a first order filter. The reason why a first order low pass filter is used for the additional feedback filter is among others that noise and signal errors are suppressed in the utility band below $f_0$ while it promotes the high frequency band to support the desired instability around $f_{SW}$ as it affects the closed loop in an inverse manner due to its position in the feedback path.

It can be seen from the plot that the full −90° phase shift is present at the switching frequency $f_{SW}$.

The additional compensation filtering means ACFM that appears in the additional feedback path is described above with reference to FIG. 17 as it also appears in the first feedback path.

FIG. 20 shows a Bode-plot of the resulting additional feedback path transfer function $T_A(s)$ comprising the additional feedback filtering means AFFM and the additional compensation filtering means ACFM. It can be seen from the plot that the phase shift is −135° at the switch frequency $f_{SW}$.

When adding the two open loop feedback paths $T_F(s)$ and $T_A(s)$ the following open loop expression $T_{OL}(s)$ is obtained:

$$T_{OL}(s) = T_{CM}(s) \cdot \left( \frac{T_{AFFM}(s)T_{ACFM}(s) +}{T_{DM}(s)T_{FFFM}(s)T_{FCFM}(s)T_{ACFM}(s)} \right)$$

$$= T_{CM}(s) \cdot (k_F + k_A) \cdot$$

$$\frac{(s + 2\pi f_0) \cdot \left( s^2 + \frac{2\pi f_0}{Q_Z} + (2\pi f_0)^2 \right)}{(s + 2\pi f_{DC})^2 \cdot (s + 2\pi f_{SW})^2 \cdot \left( s^2 + \frac{2\pi f_0}{Q} + (2\pi f_0)^2 \right)}$$

where $k_F$ and $k_A$ represent the gain of the first feedback path and additional feedback path, respectively,
and where Q is the Q of the demodulation means DM and $$Q_Z = \frac{Q \cdot \left( 1 + \frac{k_F}{k_A} \right)}{1 + 2 \cdot Q \cdot \frac{k_F}{k_A}}$$

From the expression for $T_{OL}(s)$ it can be seen that the open loop transfer function has six poles, two at $f_{DC}$, two at $f_0$ and two at $f_{SW}$ as well as three zeroes, all at $f_0$. This makes the current embodiment of a self-oscillating circuit a sixth order network. As the demodulation means DM of this embodiment has two poles and is thus a second order component the order of the full circuit exceeds the order of the demodulation means itself by four.

FIG. 21 shows a Bode-plot of the total open loop transfer function excluding the non-linear comparator means CM. From the plot it is seen that the logarithmic amplitude is −30 dB at the switch frequency $f_s$. This is because the comparator means CM is yet excluded from the characteristic. If it has a gain of +30 dB at $f_{SW}$ then the open loop characteristic will have a gain of 0 dB at the switch frequency. Furthermore, it is seen that the phase shift is only approximately −155° at the switch frequency. This is again because of the excluded comparator means CM which, as described above, introduces a delay which causes an additional phase shift. Furthermore, it can be seen that the present embodiment of the invention has an open loop gain of more than 75 dB at DC and almost the same at 1 kHz.

FIG. 22A to 22C show three of the several possible feedbacks pick off points. FIG. 22A comprises the demodulation means DM in one of the possible demodulation means embodiments, a second order LC low-pass filter. Two feedback paths are picked off, a first path FFP before the demodulation means DM and an additional path AFP subsequent to the demodulation means DM. This embodiment is described above with the preferred embodiment of the invention.

FIG. 22B shows the same demodulation means DM, first feedback path FFP and additional feedback path AFP as FIG. 22A but shows the first path FFP as being picked off as a measure of the current through the coil DML. Thereby, the demodulation means DM may be treated as a first order component when considering open loop characteristics of the self-oscillating circuit. However, the first feedback path will not be able to suppress errors or noise introduced by the subsequent parts of the demodulation means DM, e.g. the demodulation capacitor DMC.

FIG. 19C again comprises the demodulation means DM, the first feedback path FFP and additional feedback path AFP but shows the additional path AFP as being picked off as a measure of the current through the coil DML. Thereby, the additional feedback path will comprise one pole from the demodulation means and the first feedback path will comprise the same pole and one additional pole from the demodulation means.

The invention claimed is:

1. A self-oscillating circuit comprising comparator means (CM) comprising at least one input means (IM) and at least one output means (OM),
    at least one of said at least one output means (OM) is coupled to at least one of said at least one input means (IM) via at least one filtering means (FM),
    said at least one filtering means (FM) at least partly comprising demodulation means (DM),
    wherein said filtering means (FM) is of at least fifth order.

2. A self-oscillating circuit according to claim 1, wherein a number of filter poles comprised by said filtering means (FM) is at least five.

3. A self-oscillating circuit according to claim 1, wherein a number of filter poles comprised by said filtering means (FM) is at least eight.

4. A self-oscillating circuit according to claim 1, wherein a number of filter poles comprised by said filtering means (FM) is at least eleven.

5. A self-oscillating circuit according to claim 1, wherein a number of filter zeroes comprised by said filtering means (FM) is at least two.

6. A self-oscillating circuit according to claim 1, wherein a number of filter zeroes comprised by said filtering means (FM) is at least five.

7. A self-oscillating circuit according to claim 1, wherein a number of filter zeroes comprised by the characteristic of said filtering means FM is at least eight.

8. A self-oscillating circuit according to claim 1, wherein a number of filter poles comprised by said filtering means (FM) exceeds a number of filter zeroes by three.

9. A self-oscillating circuit according to claim 1, wherein at least one filter zeroes comprised by said filtering means (FM) cancels at least one filter poles.

10. A self-oscillating circuit according to claim 9, wherein a location of at least one of said filter zeroes is determined on the basis of a location of at least one of said filter poles.

11. A self-oscillating circuit according to claim 10, wherein the location of each of said filter zeroes is determined on a basis of the locations of said filter poles.

12. A self-oscillating circuit according to claim 1, wherein said self-oscillating circuit oscillates at a switch frequency ($f_{SW}$) higher than an upper frequency ($f_0$) of a utility frequency band.

13. A self-oscillating circuit according to claim 12, wherein said utility frequency band is an audio band.

14. A self-oscillating circuit according to claim 12, wherein said utility frequency band comprises frequencies in a range of 0 Hz to 100 kHz.

15. A self-oscillating circuit according to claim 12, wherein said utility frequency band comprises frequencies in the range of 0 Hz to 60 kHz.

16. A self-oscillating circuit according to claim 12, wherein said utility frequency band comprises frequencies in the range of 20 Hz to 20 kHz.

17. A self-oscillating circuit according to claim 1, wherein said self-oscillating circuit comprises a switch mode amplifier (AM).

18. A self-oscillating circuit according to claim 12, wherein said switch frequency ($f_{SW}$) is at least partly determined by means of filter poles and filter zeroes.

19. A self-oscillating circuit according to claim 12, wherein a phase margin of an open loop characteristic for frequencies within a frequency band having a lower frequency of one tenth of said switch frequency ($f_{SW}$) and an upper frequency of said switch frequency ($f_{SW}$) is between 0° and 60°.

20. A self-oscillating circuit according to claim 12, wherein a phase margin of an open loop characteristic for frequencies within a frequency band having a lower frequency of one tenth of said switch frequency ($f_{SW}$) and an upper frequency of said switch frequency ($f_{SW}$) is between 0° and 45°.

21. A self-oscillating circuit according to claim 12, wherein a phase margin of an open loop characteristic for frequencies within a frequency band having a lower frequency of one tenth of said switch frequency ($f_{SW}$) and an upper frequency of said switch frequency ($f_{SW}$) is between 0° and 30°.

22. A self-oscillating circuit according to claim 12, wherein a gain of an open loop characteristic at a frequency of one hundredth of said switch frequency ($f_{SW}$) exceeds a gain at said switch frequency ($f_{SW}$) by at least 50 dB.

23. A self-oscillating circuit according to claim 12, wherein a gain of an open loop characteristic at a frequency of one hundredth of said switch frequency ($f_{SW}$) exceeds a gain at said switch frequency ($f_{SW}$) by at least 60 dB.

24. A self-oscillating circuit according to claim 12, wherein a gain of an open loop characteristic at a frequency of one hundredth of said switch frequency ($f_{SW}$) exceeds a gain at said switch frequency ($f_{SW}$) by at least 70 dB.

25. A self-oscillating circuit according to claim 1, wherein said filtering means (FM) comprises additional auxiliary filter poles or zeroes.

26. A self-oscillating circuit according to claim 12, wherein said upper frequency ($f_0$) of said utility frequency band is determined as a break frequency of said demodulation means (DM).

27. A self-oscillating circuit according to claim 1 wherein said demodulation means (DM) comprises at least one filter pole.

28. A self-oscillating circuit according to claim 1, wherein said demodulation means (DM) comprises at least two filter poles.

29. A self-oscillating circuit according to claim 1, wherein said filtering means (FM) comprises at least one feedback filtering means (FFM) and at least one compensation filtering means (CFM).

30. A self-oscillating circuit according to claim 1, wherein said self-oscillating circuit comprises at least two feedback paths.

31. A self-oscillating circuit according to claim 1, wherein said self-oscillating circuit comprises a first feedback path comprising at least partly said demodulation means (DM), a first feedback filtering means (FFFM) and a first compensation filtering means (FCFM) and an additional feedback path comprising an additional feedback filtering means (AFFM) and an additional compensation filtering means (ACFM).

32. A self-oscillating circuit according to claim 31, wherein said additional feedback path at least partly comprises said demodulation means (DM).

33. A self-oscillating circuit according to claim 1 wherein said comparator means (CM) comprises a hysteresis comparator.

34. A self-oscillating circuit according to claim 17, wherein said switch mode amplifier (AM) comprises two switches.

35. A self-oscillating circuit according to claim 17, wherein said switch mode amplifier (AM) is a power amplifier.

36. A self-oscillating circuit according to claim 17, wherein said switch mode amplifier (AM) comprises MOSFET transistors.

37. A self-oscillating circuit according to claim 1, wherein said demodulation means (DM) is a low-pass filter.

38. A self-oscillating circuit according to claim 1, wherein said demodulation means (DM) comprises auxiliary circuitry.

39. A self-oscillating circuit according to claim 38, wherein said auxiliary circuitry comprises means for protecting said self-oscillating circuit.

40. A self-oscillating circuit according to claim 38, wherein said auxiliary circuitry comprises a Zöbel network.

41. A self-oscillating circuit according to claim 38, wherein said auxiliary circuitry comprises means for impedance matching.

42. A self-oscillating circuit according to claim 12, wherein said switch frequency ($f_{SW}$) is comprised by a frequency band from 100 kHz to 100 MHz.

43. A self-oscillating circuit according to claim 31, wherein said first feedback filtering means (FFFM) is a high-pass filter.

44. A self-oscillating circuit according to claim 31, wherein said first feedback filtering means (FFFM) comprises a zero at an upper frequency ($f_0$) of the utility frequency band.

45. A self-oscillating circuit according to claim 31, wherein said first compensation filtering means (FCFM) is a phase-lag filter.

46. A self-oscillating circuit according to claim 31, wherein said first compensation filtering means (FCFM) comprises a pole at a low frequency ($f_{DC}$), a zero at an upper frequency ($f_0$) of the utility frequency band and a pole at a switch frequency ($f_{SW}$).

47. A self-oscillating circuit according to claim 31, wherein said additional feedback filtering means (AFFM) is a low-pass filter.

48. A self-oscillating circuit according to claim 31, wherein said additional feedback filtering means (AFFM) comprises a pole at an upper frequency ($f_0$) of the utility frequency band.

49. A self-oscillating circuit according to claim 31, wherein said additional compensation filtering means (ACFM) is a phase-lag filter.

50. A self-oscillating circuit according to claim 31, wherein said additional compensation filtering means (ACFM) comprises a pole at a low frequency ($f_{DC}$), a zero at an upper frequency ($f_0$) of the utility frequency band and a pole at a switch frequency ($f_{SW}$).

51. A self-oscillating circuit according to claim 17, wherein said switch mode amplifier (AM) is of a differential output type.

* * * * *